US009740644B2

(12) United States Patent
Anvin et al.

(10) Patent No.: US 9,740,644 B2
(45) Date of Patent: Aug. 22, 2017

(54) AVOIDING PREMATURE ENABLING OF NONMASKABLE INTERRUPTS WHEN RETURNING FROM EXCEPTIONS

(71) Applicant: Intel Corporation, Santa Clara, CA (US)

(72) Inventors: H. Peter Anvin, San Jose, CA (US); Gilbert Neiger, Hillsboro, OR (US)

(73) Assignee: Intel Corporation, Santa Clara, CA (US)

(*) Notice: Subject to any disclaimer, the term of this patent is extended or adjusted under 35 U.S.C. 154(b) by 267 days.

(21) Appl. No.: 14/498,884

(22) Filed: Sep. 26, 2014

(65) Prior Publication Data

US 2016/0092382 A1    Mar. 31, 2016

(51) Int. Cl.
| G06F 9/30 | (2006.01) |
| G06F 13/24 | (2006.01) |
| G11C 7/10 | (2006.01) |

(52) U.S. Cl.
CPC ............ *G06F 13/24* (2013.01); *G11C 7/1072* (2013.01)

(58) Field of Classification Search
CPC .... G06F 9/4812; G06F 9/3865; G06F 9/3861; G06F 2213/24
See application file for complete search history.

(56) References Cited

U.S. PATENT DOCUMENTS

| 5,179,702 A * | 1/1993 | Spix ........................ G06F 8/41 |
| | | 711/E12.006 |
| 5,303,378 A * | 4/1994 | Cohen ................. G06F 12/1491 |
| | | 710/264 |
| 5,349,667 A | 9/1994 | Kaneko |
| 5,987,258 A * | 11/1999 | Daniel .................... G06F 9/462 |
| | | 710/260 |
| 7,640,450 B1 | 12/2009 | Anvin et al. |
| 8,010,726 B2 | 8/2011 | Francis |
| 8,103,816 B2 | 1/2012 | Tiruvallur et al. |

(Continued)

FOREIGN PATENT DOCUMENTS

WO    2016/048591 A1    3/2016

OTHER PUBLICATIONS

Intel 64 and IA-32 Architectures Software Developer's Manual, Combined vols. 1, 2A, 2B, 2C, 3A, 3B and 3C, Oct. 2011.*

(Continued)

*Primary Examiner* — Farley Abad
(74) *Attorney, Agent, or Firm* — Vecchia Patent Agent, LLC

(57) ABSTRACT

A processor of an aspect includes a decode unit to decode an exception handler return instruction. The processor also includes an exception handler return execution unit coupled with the decode unit. The exception handler return execution unit, responsive to the exception handler return instruction, is to not configure the processor to enable delivery of a subsequently received nonmaskable interrupt (NMI) to an NMI handler if an exception, which corresponds to the exception handler return instruction, was taken within the NMI handler. The exception handler return execution unit, responsive to the exception handler return instruction, is to configure the processor to enable the delivery of the subsequently received NMI to the NMI handler if the exception was not taken within the NMI handler. Other processors, methods, systems, and instructions are disclosed.

19 Claims, 14 Drawing Sheets

(56) References Cited

U.S. PATENT DOCUMENTS

| | | | |
|---|---|---|---|
| 8,135,894 B1* | 3/2012 | Ball | G06F 13/26 710/264 |
| 8,707,433 B1 | 4/2014 | Mann | |
| 2002/0002669 A1 | 1/2002 | Yoshioka et al. | |
| 2004/0078560 A1 | 4/2004 | Adl-Tabatabai et al. | |
| 2005/0010707 A1 | 1/2005 | Francis | |
| 2008/0294878 A1 | 11/2008 | Yuasa et al. | |
| 2010/0293342 A1 | 11/2010 | Morfey et al. | |
| 2011/0016295 A1 | 1/2011 | Catherwood et al. | |

OTHER PUBLICATIONS

Intel, "IA-32 Intel® Architecture Software Developer's Manual", vol. 3A, System Programming Guide, Part 1, Order Number. 253668-019, Mar. 2006, 636 pages.

International Search Report and Written Opinion received for PCT Patent Application No. PCT/US2015/047735, mailed on Dec. 8, 2015, 11 pages.

Notice of Allowance and Search Report received for Taiwan Patent Application No. 104127158, mailed on Jun. 30, 2016, 4 pages of Taiwan Notice of Allowance including 1 page of English translation of Search Report.

International Preliminary Report on Patentability and Written Opinion Received for PCT Patent Application No. PCT/US2015/047735, dated Apr. 6, 2017, 8 pages.

* cited by examiner

AVOIDING PREMATURE ENABLING OF NONMASKABLE INTERRUPTS WHEN RETURNING FROM EXCEPTIONS

BACKGROUND

Technical Field

Embodiments described herein generally relate to computer systems. In particular, embodiments described herein generally relate to the handling of interrupts and exceptions in computer systems.

Background Information

During operation, processors and computer systems commonly encounter what are known as interrupts and exceptions. The interrupts and exceptions generally represent conditions or events that exist in any of various locations in the system, within the processor, or within a currently executing program or task, and demand the attention of the processor. These interrupts and exceptions commonly cause the processor to suspend the processing of the currently executing program or task, and transfer control flow to an interrupt or exception handler module, which handles the interrupt or exception. This is often referred to as servicing or handling the interrupt or exception.

An interrupt often but not always refers to an external condition or event that occurs externally to a given processor or core. For example, an input and/or output (I/O) device, a timer, a peripheral device, an external processor, or other external hardware external to a given processor or core, may deliver the interrupt to the given processor or core. As another example, one core of a processor may deliver an interrupt to another core of the processor. However, not all interrupts are due to external events. Certain interrupts may be generated internally to a core and may be delivered as interrupts because they are asynchronous. Certain interrupts are not asynchronous. For example, there are certain synchronous core-originated interrupts. As another example, an interrupt may be asserted synchronously to reissue or reassert a missed or delayed (e.g., masked) interrupt. Typically, the majority of interrupts are asynchronous and are generated due to external conditions.

In contrast, an exception typically refers to an internal condition or event that occurs internally to a given processor or core. For example, exceptions commonly result from instructions being executed within the execution pipeline of a given processor or core. Exceptions generally represent synchronous events that are generally triggered by the execution of an instruction, and that are generally delivered with a specific relationship to the associated instruction. Certain types of synchronous events (e.g., faults) are generally delivered instead of executing the associated instruction, whereas other types of synchronous events (e.g., traps) are generally delivered immediately after executing the associated instruction.

Interrupts may be further classified as maskable interrupts and nonmaskable interrupts (NMI). Maskable interrupts may be masked. For example, certain processors have a maskability control, such as, for example, a flag, condition code, or status bit, that permits all maskable interrupts to be masked as a group. For example, certain Intel Architecture compatible processors have an interrupt flag (IF) that when cleared to binary zero does not permit the maskable interrupts to be delivered to software, but when set to binary one permits the maskable interrupts to be delivered to software.

In contrast to maskable interrupts, the nonmaskable interrupts (NMI) generally cannot be masked by the maskability control (e.g., the IF flag) used to mask the maskable interrupts. However, once an NMI has been delivered to software, certain processors may invoke a hardware condition to attempt to prevent the delivery of further NMI to software until handling of the initial NMI has completed. For example, it is described in part in Intel® 64 and IA-32 Architectures Software Developer's Manual, Volume 3A, Order Number 325462-051US, published June 2014, Sections 6.7 and 6.7.1, that upon receipt of a NMI, the processor may invoke certain hardware conditions to attempt to ensure that no other interrupts, including NMI interrupts, are received until an NMI handler responsible for handling the NMI has completed executing and returns control flow to the originating program or task. Such blocking or deferring of the delivery of further NMIs attempts to prevent nested execution of the NMI handler.

BRIEF DESCRIPTION OF THE DRAWINGS

The invention may best be understood by referring to the following description and accompanying drawings that are used to illustrate embodiments. In the drawings.

DETAILED DESCRIPTION OF EMBODIMENTS

Figure 1:
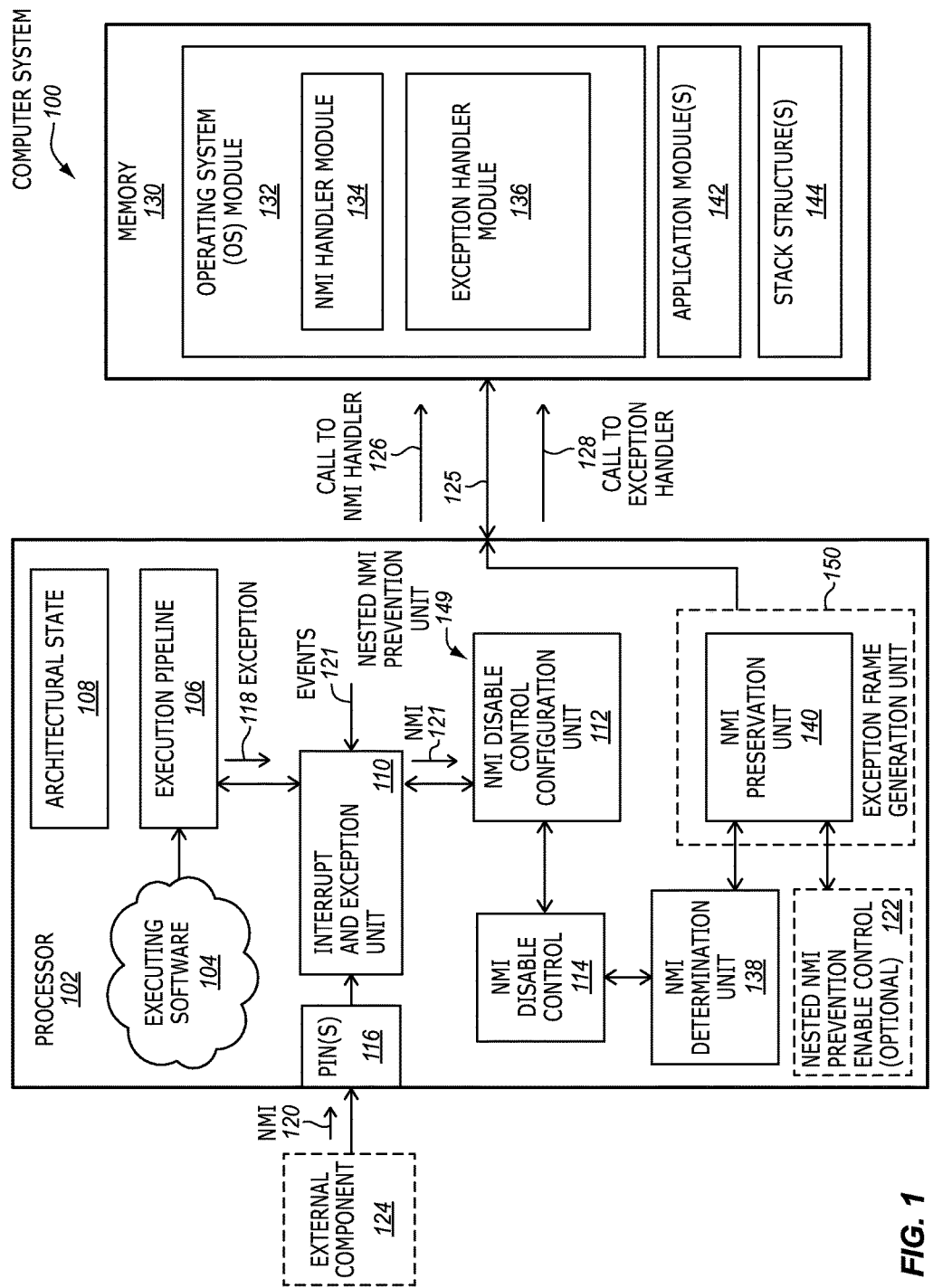
FIG. 1 is a block diagram of an embodiment of a computer system in which embodiments of the invention may be implemented and having an embodiment of a nested NMI prevention unit.

One challenge with handling NMI in processors is that delivery of further NMI may be prematurely enabled upon returning from exceptions. As discussed in the Background Section, upon receipt of an NMI, certain processors may invoke certain hardware conditions to attempt to ensure that no other interrupts, including NMI interrupts, are received until an NMI handler responsible for handling the NMI has completed executing and returns control flow to the originating program or task. For example, a processor may respond to receipt of an NMI by disabling or deferring temporarily (consistent with the term "nonmaskable") delivery of subsequent NMI by a software-invisible NMI disable control (e.g., an NMI disable bit). When the NMI handler returns (e.g., using an IRET instruction or other NMI handler return instruction), the processor may configure the NMI disable control to re-enable delivery of further NMI (e.g., by clearing the NMI disable bit). However, a return from an exception may also configure the NMI disable control to re-enable the delivery of further NMI (e.g., by clearing the NMI disable bit). For example, both NMI handlers and exception handlers may use the same instruction (e.g., an IRET instruction or other handler return instruction) to return from the handler to the program or task, and this return instruction may configure the NMI disable control to re-enable delivery of further NMI (e.g., by clearing the NMI disable bit) regardless of whether the return is from an NMI or an exception. Even if the same instruction is not used to return from both NMI and exception handlers it remains possible that return from an exception handler may re-enable the delivery of further NMIs.

As a result, if an exception is taken while handling an NMI (e.g., while an NMI handler is handling the NMI and before the NMI handler returns), then the exception handler when it returns may prematurely re-enable the delivery of subsequent NMI. Moreover, it is not uncommon for exceptions to occur within NMI, such as, for example, due to page faults, machine check exceptions, or other types of exceptions. One potential problem with such premature re-enabling of the delivery of further NMI is that it may inadvertently permit the NMI to nest by allowing a second NMI to be delivered to an NMI handler before the NMI handler has completed the handling of an earlier delivered NMI (e.g., nested execution of NMI handler). This may tend to cause operating system instability and/or potentially fatal errors, since the processing of the NMI may rely on task gates, interrupt stack table (IST) or other features of the processor that are not fully compatible with nested NMI. This may tend to be especially problematic when the processors are used in high-reliability environments where NMI and exceptions such as machine check exceptions (#MC) are generally expected to coexist.

Disclosed herein are methods, apparatus, systems, and instructions to avoid premature enabling of nonmaskable interrupts when returning from exceptions. In the following description, numerous specific details are set forth (e.g., specific microarchitectural details, sequences of operations, instruction operations, etc.). However, embodiments may be practiced without these specific details. In other instances, well-known circuits, structures and techniques have not been shown in detail to avoid obscuring the understanding of the description.

FIG. 1 is a block diagram of an embodiment of a computer system 100 in which embodiments of the invention may be implemented. In various embodiments, the computer system may represent a desktop computer, a laptop computer, a notebook computer, a tablet computer, a netbook, a smartphone, a cellular phone, a server, a network device (e.g., a router, switch, etc.), a media player, a smart television, a nettop, a set-top box, a video game controller, or other types of electronic devices known in the arts. The computer system includes a processor 102 and a memory 130. The processor and the memory are coupled, or otherwise in communication with one another, by a conventional coupling mechanism 125 (e.g., through one or more buses, hubs, memory controllers, chipset components, or the like).

In some embodiments, the processor 102 may be a general-purpose processor (e.g., a general-purpose microprocessor or central processing unit (CPU) of the type used in desktop, laptop, or other computers). Alternatively, the processor may be a special-purpose processor. Examples of suitable special-purpose processors include, but are not limited to, network processors, communications processors, cryptographic processors, graphics processors, co-processors, embedded processors, digital signal processors (DSPs), and controllers (e.g., microcontrollers). The processor may have any of various complex instruction set computing (CISC) architectures, reduced instruction set computing (RISC) architectures, very long instruction word (VLIW) architectures, hybrid architectures, other types of architectures, or have a combination of different architectures (e.g., different cores may have different architectures).

The memory 130 may include one or more different memory devices and/or one or more different types of memory. For example, in some embodiments, the memory may include dynamic random access memory (DRAM), whereas in other embodiments, the memory may include flash memory. The memory includes an operating system (OS) module 132. Although a single OS module is shown, other embodiments may optionally include two or more OS modules and/or may optionally include a virtual machine manager (VMM) module, a hypervisor module, or the like. The OS module includes an NMI handler module 134 and an exception handler module 136. The memory also includes one or more application module(s) 142, such as, for example, word processing applications, spreadsheets, drawing applications, email applications, etc. The memory also has one or more stack structures 144 that may be used to store information about the active routines of a computer program in order to help keep track of the point to which the active routines should return control when they finish executing. The stack structure(s) are also sometimes referred to as call stack structures, execution stack structures, runtime stack structures, machine stack structures, or simply as the stack.

During operation, executing software 104 may execute on the processor. The executing software may include macroinstructions or instructions of an instruction set of the processor that are loaded from the memory (e.g., from the OS module and/or the application module(s)), and executed by an execution pipeline 106 (e.g., a decoder, execution unit, etc.). The executing software may utilize an associated architectural state 108, such as, for example, flag registers, a program counter, a code segment selector, general-purpose registers, packed data registers, other architectural registers, and the like.

During operation, the processor may encounter a nonmaskable interrupt (NMI). The NMI may be encountered in different ways in different embodiments. In some embodiments, the processor may include an interrupt and exception unit 110 to receive events 121 corresponding to NMI. For example, the interrupt and exception unit 110 may include a programmable interrupt controller (e.g., a local advanced programmable interrupt controller (LAPIC)) to collect the events 121 from various internal and/or external sources and map them to interrupts or exceptions (e.g., NMI, non-NMI interrupts, exceptions, system management interrupts (SMI), etc.) and an interrupt and/or exception unit to receive and process the interrupts or exceptions, although the scope of the invention is not so limited. As another example, an NMI 120 may be received at the processor from an external component 124 (e.g., an input/output device, a peripheral device, another processor, etc.) on one or more pins 116 of the processor. In some cases, there may be a pin dedicated to receipt of the NMI 120. The NMI 120 received on the pin(s) may be provided to the interrupt and exception unit 110. As yet another example, in some cases, the interrupt and exception unit 110 (e.g., a programmable interrupt controller) may optionally have a timer (not shown), which may be used to generate NMI for debugging, profiling, or otherwise. Other processors may have various other known interrupt and exception handling capabilities besides the described interrupt and exception unit 110. The processor may initiate handling of the NMI received in these various different ways by making a call 126 to the NMI handler module 134. For example, the processor may consult an interrupt and/or exception descriptor table structure or other structure of the processor to locate an interrupt vector corresponding to the NMI, and may then call an NMI handler corresponding to the located interrupt vector. In the particular case of Intel Architecture, NMI are assigned to interrupt vector 2. The NMI handler module may begin to handle or service the NMI.

The processor also has a nested NMI prevention unit 149. The nested NMI prevention unit (e.g., an NMI disable control configuration unit 112) may receive an indication 121 that an NMI (e.g., from any of the previously described sources) has occurred. Responsive to the indication of the NMI 121, the processor and/or the nested NMI prevention unit may prevent nested NMI by temporarily disabling or deferring delivery of further NMIs. In some embodiments, the nested NMI prevention unit may have an NMI disable control 114. The NMI disable control may broadly represent a bit, set of bits, mode, or hardware condition to alternately enable and defer delivery of further NMI. For example, an NMI disable bit or set of bits may have a first value (e.g., a bit may be cleared to binary zero) to enable the delivery of further NMI, or alternately may have a second different value (e.g., the bit may be set to binary one) to temporarily disable or defer the delivery of further NMI. In some embodiments, the nested NMI prevention unit may have the NMI disable control configuration unit 112 to configure the NMI disable control 114 to alternately enable or defer delivery of further NMI. Responsive to the indication of the NMI 121, the NMI disable control configuration unit 112 may be operative to configure the NMI disable control 114 to temporarily disable or defer delivery of further NMI (e.g., may set a single bit to binary one). Representatively, the NMI disable control, when configured to temporarily block or disable delivery of subsequent NMI, may cause or configure the interrupt and exception unit 110 (or logic or circuitry thereof) to temporarily block or defer the delivery of the subsequent NMI. It is to be appreciated that although a single bit may be sufficient, two or more bits may optionally be used, and that any desired value of one bit or two or more bits may be used according to any desired convention to represent the enabled and disabled states. In the illustration, the NMI disable control configuration unit and NMI disable control are shown as being separate units, although in other embodiments they may optionally be included in one of the illustrated units (e.g., in the interrupt and exception unit 110).

While the NMI (e.g., NMI 120) is being handled or serviced by the NMI handler module 134, an exception 118 may occur. In some embodiments, the exception may occur while the execution pipeline 106 is processing instructions of the executing software 104. Examples of suitable types of exceptions include faults, traps, and aborts. Whether an exception is classified a fault, trap, or abort may vary from one implementation to another and/or vary based on the different circumstances in which it occurs. Often faults and traps refer to those exceptions for which execution of the program or task that caused the exception may generally be restarted without loss of program or task continuity. Faults often represent those exceptions that can generally be corrected. Examples of different types of faults include, but are not limited to, page faults, general protection faults, segment not present, stack-segment faults, divide errors, invalid or undefined opcodes, math coprocessor not available, math faults, alignment check faults, SIMD floating point exception faults, virtualization exception faults, and the like. Traps often represent those exceptions that are delivered after the instruction that caused them completes. Examples of different types of traps include, but are not limited to, breakpoint traps and overflow traps. In contrast to faults and traps, aborts often represent those exceptions that often do not allow the program or task that caused the exception to be restarted without loss of program or task continuity. Aborts often refer to unusual events that are hard to recover from. Examples of different types of aborts include, but are not limited to, double fault aborts and machine check aborts.

The exception may be provided to the interrupt and exception unit 110. The interrupt and exception unit, or the processor, responsive to the receipt of the exception, may initiate handling of the exception by making a call 128 to the exception handler module 136. For example, the processor may consult the interrupt and/or exception descriptor table structure, or other structure of the processor, to locate a vector corresponding to the exception, and may then call the exception handler corresponding to the located vector.

The nested NMI prevention unit 149 has an embodiment of an NMI determination unit 138 and an NMI preservation unit 140. Each of these components may be implemented in hardware (e.g., integrated circuitry), firmware (e.g., microcode or other instructions or code stored on a non-volatile storage), or a combination thereof. The NMI determination unit may be operative to determine whether the exception 118 was taken within an NMI (e.g., during execution of the NMI handler 134). In some embodiments, the NMI determination unit may be coupled with and operative to check the NMI disable control 114 in order to make this determination. If the NMI disable control indicates that delivery of further NMI should be temporarily disabled or deferred, then the NMI determination unit may infer that the exception 118 was taken within the NMI (e.g., NMI 120). Conversely, if the NMI disable control 114 indicates that delivery of further NMI is not deferred, then the NMI determination unit may infer that the exception 118 was not taken within an NMI. In the present example, since the exception 118 was taken within the NMI (e.g., after the NMI handler module was called but before it was able to finish handling the NMI and return to the interrupted program or task), the NMI determination unit 138 will determine that the exception was taken within the NMI (e.g., within the NMI handler execution).

Referring again to FIG. 1, the nested NMI prevention unit 149 also has an NMI preservation unit 140. The NMI preservation unit may be coupled with, or otherwise in communication with, the NMI determination unit 138. The NMI preservation unit may be operative, when the exception was taken within the NMI, to store or otherwise preserve an indication that the exception was taken within the NMI. In some embodiments, a bit or set of bits may have a first value (e.g., a single bit may be set to binary one (or alternatively cleared to binary zero)) to indicate that the exception was taken within the NMI, or may have a second, different value (e.g., the single bit may be cleared to binary zero (or alternatively set to binary one)) to indicate that the exception was not taken within the NMI. Preserving an indication that the exception was or was not taken within the NMI may also be viewed as preserving an indication that the delivery of further NMIs should be deferred or not deferred and/or preserving the NMI disable control 114 value. For example, if the exception was taken within the NMI it may correspond to a first value of the NMI disable control, whereas if the exception was not taken within the NMI it may correspond to a second, different value of the NMI disable control.

The indication may be stored or preserved in various different locations in different embodiments. In some embodiments, the indication may be stored or otherwise preserved in an exception frame that is to be stored in memory (e.g., in a stack structure (e.g., stack structure(s) 144)). As shown, in some embodiments, the NMI preservation unit 140 may optionally be part of an exception frame generation unit 150. Alternatively, the NMI preservation unit may optionally be separate from but coupled or otherwise in communication with the exception frame generation unit. One advantage of storing the indication in the exception frame on the stack structure is that the stack structure may already have native built-in support for nesting that may be leveraged. As another option, in other embodiments, the indication may be stored or preserved (e.g., in an exception frame or other data structure) in a task state segment (TSS) or similar structure. The TSS may represent a structure that is used to store information about a task and is used by the operating system module for task management. For example, the OS module may store information on the TSS upon task switches. In addition the preserved indication, other information that may be stored in the TSS includes, for example, processor register state, I/O port permissions, inner-level stack pointers, a previous TSS link, etc. In still embodiments, the indication may be stored or otherwise preserved in a data structure within or accessible to the exception handler (e.g., in some location in the memory 130). In such embodiments, the indication may also include information sufficient to allow it to be associated with the exception frame and its associated content (e.g., the preserved architectural state). In still other embodiments, the indication may be stored or otherwise preserved in processor registers potentially along with exception state that are used instead of and/or in addition to the exception frame on the stack to pass information between the processor and the exception handler module.

Advantageously, as will be explained further below, preserving the indication of whether or not the exception was taken within an NMI may be used to conditionally determine whether or not to re-enable prompt delivery of further NMIs upon returning from the exception handler. For example, an exception handler return instruction when performed by the processor may re-enable immediate delivery of further NMIs if the exception was not taken during the NMI handling, but may abstain from re-enabling delivery of further NMI if the exception was taken during the NMI handling. Abstaining from re-enabling the delivery of further NMI under such conditions may help to prevent nesting of NMI and the associated problems that may result therefrom.

In some embodiments, the previously described capability of the exception handler module 136 to help prevent premature enabling of delivery of NMI may always be enabled or turned on. In other embodiments, this capability may be configured to be enabled and disabled, for example, by an operating system or other privileged and/or system-level software. For example, the processor may optionally have a nested NMI prevention enable control 122. The nested NMI prevention enable control may include, for example, one or more bits that may have a first value (e.g., a single bit may be set to binary one (or alternately cleared to binary zero)) to enable a nested NMI prevention capability/mechanism (e.g., including the previously described capability of the exception handler module), or the one or more bits may have a second different value (e.g., the single bit may be cleared to binary zero (or alternately set to binary one)) to disable the nested NMI prevention capability/mechanism. In this way the system may either use or not use this capability/mechanism as desired for the particular implementation.

Figure 2:
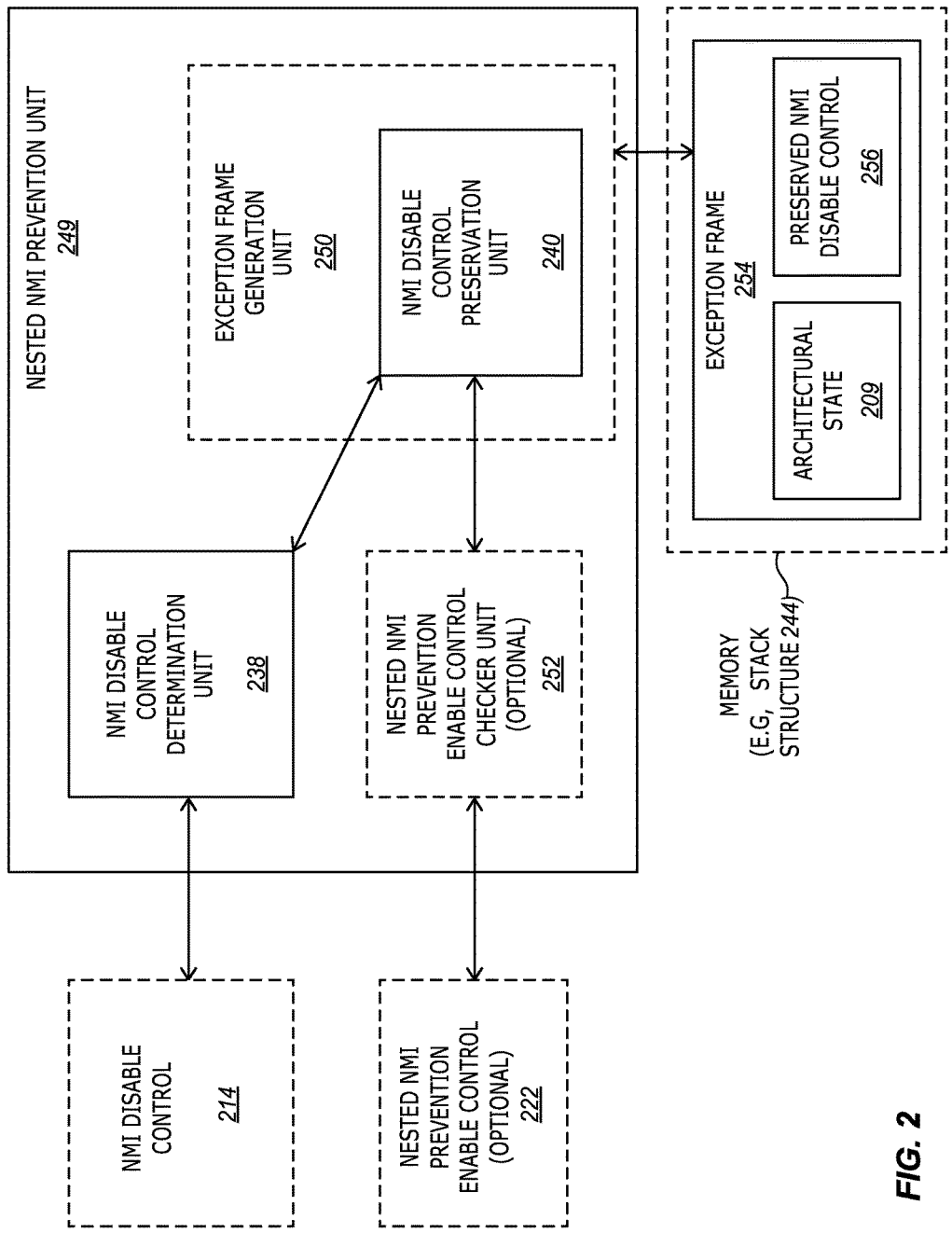
FIG. 2 is a block diagram of an embodiment of nested NMI prevention unit that is operable to preserve an indication of whether or not an exception was taken within an NMI handler in an exception frame.

FIG. 2 is a block diagram of an embodiment of a nested NMI prevention unit 249 that is operable to help prevent nested NMI by preserving an indication 256 of whether or not an exception was taken within an NMI handler (e.g., in an exception frame 254). In this embodiment, the indication 256 of whether or not the exception was taken within the NMI handler is implemented as a preserved NMI disable control value 256.

The nested NMI prevention unit 249 includes an NMI disable control determination unit 240 that may be operative to determine an NMI disable control value. This may also or alternatively be viewed as determining whether or not an exception, which corresponds to a call to the exception handler module, was taken within an NMI handler. The NMI disable control determination unit may be coupled with, or otherwise in communication with, an NMI disable control 214 (e.g., NMI disable control 114).

The nested NMI prevention unit 249 also includes an NMI disable control preservation unit 240. The NMI disable control preservation unit is coupled with, or otherwise in communication with, the NMI disable control determination unit in order to receive the current NMI disable control value.

As shown, in some embodiments, the NMI disable control preservation unit may optionally be a part of an exception frame generation unit 250. The exception frame generation unit is operative to generate an exception frame 254 for an exception and store the exception frame in memory (e.g., push or otherwise store the exception frame onto a stack structure 244). The exception frame may include architectural state 209 of the type conventionally found in exception frames. For example, this architectural state may include a copy of the return instruction pointer, the return code segment selector, and the processor flags. In such embodiments, the NMI disable control preservation unit may be operative to have a preserved copy of the NMI disable control value 214 stored or otherwise included in the exception frame as a preserved NMI disable control 256. Alternatively, the preserved NMI disable control may be preserved in processor registers, as previously described.

As one specific example, if the NMI disable control value is a single bit with a value of binary one to indicate that delivery of further NMI is currently already deferred on entry into the exception handler, then the preserved NMI disable control may also include a single bit with a value of binary one to indicate that the exception was taken in the NMI handler and/or to indicate that NMI are currently already deferred on entry to the exception handler. As previously mentioned, it is mainly a matter of the adopted convention which particular values for the one or more bits are used and they may be but need not be the same convention adopted for the NMI disable control 214 of the processor and the preserved NMI disable control as long as they are understood by the logic to correspond to one another according to an adopted convention.

In some embodiments, the preserved NMI disable control 256 may represent one or more bits in the exception frame 254. In some embodiments, these one or more bits may be any previously unused bits of the exception frame not already used for some other purpose (e.g., not already used for the architectural state 209). Various previously unused bits may optionally be used. In some embodiments, the preserved NMI disable control 256 may not have a counterpart set of one or more bits in the actual architectural state of the processor (e.g., there may not be a counterpart set of one or more bits in the flags register of the processor). It is often not desired to add additional flags to the flags register of the processor (e.g., for compatibility reasons). Using a set of one or more bits of the exception frame that does not have a counterpart set of one or more bits in the flags register may allow the preservation of the NMI disable control 214 without imposing compatibility difficulties. In some embodiments, the set of one or more bits of the exception frame used for the preserved NMI disable control 256 may not be reserved bits in the flags register of the processor. In other embodiments, the set of one or more bits of the exception frame used for the preserved NMI disable control 256 may have positions in the exception frame that correspond to reserved bits in the flags register of the processor, but in some embodiments the processor may still reserve or not use these counterpart bits in the actual flags register. Alternatively, one or more bits may optionally be added to the flags register of the processor and have counterpart bits among the architectural state 209 in the exception frame 254, if desired. An embodiment of the invention pertains to an exception frame data structure having a preserved indication of whether or not an exception was taken within an NMI and/or a preserved NMI disable control.

In some embodiments, the nested NMI prevention unit 249 may optionally have a nested NMI prevention enable control checker unit 252. The nested NMI prevention enable control checker unit may be coupled with and may check an optional nested NMI prevention enable control 222 (e.g., optional nested NMI prevention enable control 122) to determine whether or not nested NMI prevention and/or preservation of the NMI disable control is currently enabled or disabled. The optional nested NMI prevention enable control checker unit is coupled with, or otherwise in communication with, the NMI disable control preservation unit 240. If nested NMI prevention and/or preservation of the NMI disable control is currently disabled, the checker module 252 may signal the NMI disable control preservation unit not to include the preserved NMI disable control in the exception frame, or otherwise it may signal it to include it.

Figure 3:
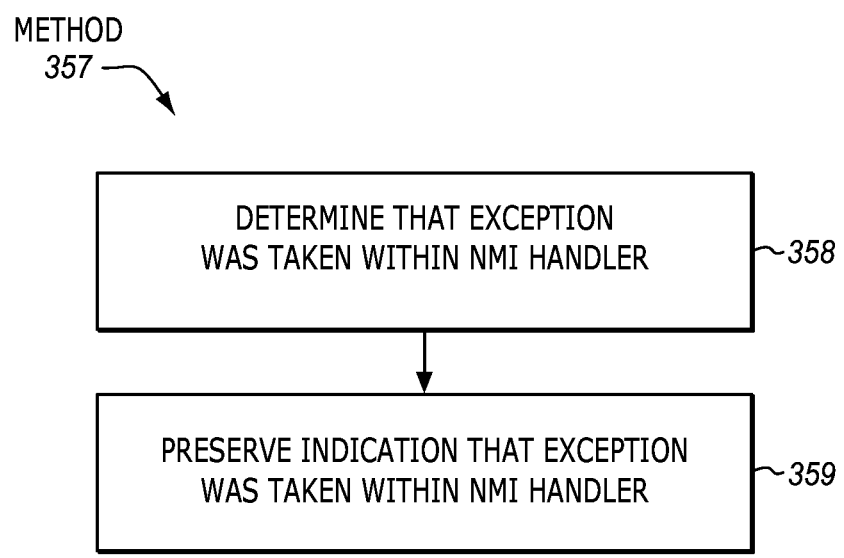
FIG. 3 is a block flow diagram of an embodiment of a method of preserving an indication that an exception was taken within an NMI handler.

FIG. 3 is a block flow diagram of an embodiment of a method 357 of preserving an indication that an exception was taken within an NMI handler. In some embodiments, the method 357 may be performed by and/or within the nested NMI prevention unit 149 of FIG. 1 and/or the nested NMI prevention unit 249 of FIG. 2. The components, features, and specific optional details described herein for the nested NMI prevention unit 149, 249 also optionally apply to the method 357. Alternatively, the method 357 may be performed by and/or within a similar or different unit or other apparatus. Moreover, the units 149, 249 may perform methods the same as, similar to, or different than the method 357.

The method includes determining that an exception was taken within an NMI handler, at block 358. In some embodiments, this determination may be made by checking an NMI disable control of a processor. In some embodiments, the NMI disable control that is checked may have a characteristic that the processor configures it to defer delivery of further NMI upon receipt of an NMI.

The method includes preserving an indication that the exception was taken within the NMI handler, at block 359. In some embodiments, the indication may be preserved in an exception frame that is to be stored in memory (e.g., pushed onto a stack structure). In some embodiments, the indication may be preserved in a set of one or more bits of the exception frame that does not have a counterpart set of one or more bits in a flags register of a processor. In some embodiments, the indication may be preserved in a set of one or more bits of the exception frame that corresponds to a set of one or more reserved bits in a flags register of a processor but the processor may still reserve the use of these bits instead of actually using them. In some embodiments, the indication may be an NMI disable control value of an NMI disable control of a processor.

Figure 4:
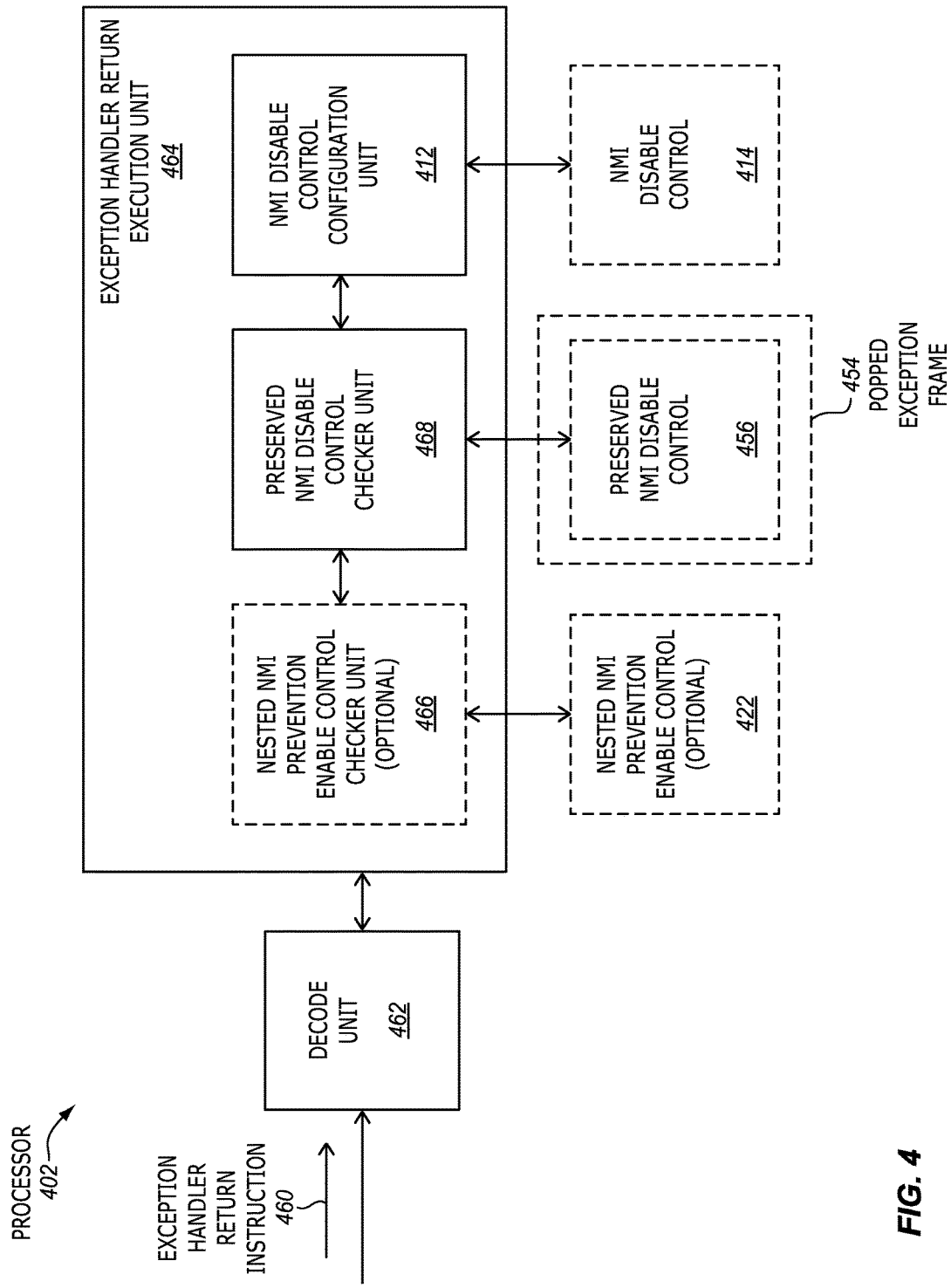
FIG. 4 is a block diagram of an embodiment of a processor to perform an embodiment of an exception handler return instruction.

FIG. 4 is a block diagram of an embodiment of a processor 402 to perform an embodiment of an exception handler return instruction 460. The processor may be any of the previously described types of processors (e.g., a general-purpose processor or a special-purpose processor). During operation, the processor may receive the exception handler return instruction. For example, the instruction may be received from memory over an interconnect. The instruction may represent a macroinstruction, assembly language instruction, machine code instruction, or other instruction or control signal of an instruction set of the processor. In some embodiments, the instruction may represent an instruction that is to be included at the end of an exception handler module and that is to be used to return control flow from the exception handler module to a program or task that was interrupted by an exception. Although the instruction is referred to herein as an exception handler return instruction, it may also optionally be an interrupt handler return instruction (e.g., an instruction used to return from both exceptions and interrupts).

The processor includes a decode unit or decoder 462. The decode unit may receive and decode the exception handler return instruction 460. The decode unit may output one or more relatively lower-level instructions or control signals (e.g., one or more microinstructions, micro-operations, micro-code entry points, decoded instructions or control signals, etc.), which reflect, represent, and/or are derived from the relatively higher-level exception handler return instruction. In some embodiments, the decode unit may include one or more input structures (e.g., port(s), interconnect(s), an interface) to receive the instruction, an instruction recognition and decode logic coupled therewith to recognize and decode the instruction, and one or more output structures (e.g., port(s), interconnect(s), an interface) coupled therewith to output the lower-level instruction(s) or control signal(s). The decode unit may be implemented using various different mechanisms including, but not limited to, microcode read only memories (ROMs), look-up tables, hardware implementations, programmable logic arrays (PLAs), and other mechanisms used to implement decode units known in the art.

An exception handler return execution unit 464 is coupled with the decode unit 462. The exception handler return execution unit may receive the one or more decoded or otherwise converted instructions or control signals that represent and/or are derived from the exception handler return instruction. The exception handler return execution unit may also receive or otherwise have access to a preserved NMI disable control 456 (e.g., the instruction may cause the exception frame 454 having the preserved NMI disable control 456 to be popped from the stack or otherwise received into the processor). The exception handler return execution unit has an optional nested NMI prevention enable control checker unit 466. The nested NMI prevention enable control checker unit is coupled with a nested NMI prevention enable control 422 of the processor and may check to determine if nested NMI prevention is enabled or disabled. If the nested NMI prevention is disabled, the exception handler return execution unit may, in some embodiments, configure the NMI disable control 412 to enable delivery of NMI regardless of the preserved NMI disable control 456.

Conversely, if the nested NMI prevention is enabled, the exception handler return execution unit 464 (e.g., the NMI disable control configuration unit 412) may, in some embodiments, configure the NMI disable control 414 to enable or defer the delivery of further NMI dependent or based on the preserved NMI disable control 456. In some embodiments, a preserved NMI disable control checker unit 468 may check or examine the preserved NMI disable control. In some embodiments, the preserved NMI disable control may be in a popped or otherwise retrieved exception frame 454 and the checker unit may check or examine the exception frame. Alternatively, the preserved NMI disable control may have already been extracted (e.g., from the retrieved exception frame) and provided to the execution unit. The preserved NMI disable control may indicate whether or not an exception, which corresponds to an exception handler from which the exception handler return instruction was used to return from, was taken within an NMI handler. An NMI disable control configuration unit is coupled with the preserved NMI disable control checker unit. The NMI disable control configuration unit is operative in response to and/or as a result of the exception handler return instruction (e.g., in response to one or more instructions or control signals decoded therefrom) not to configure the NMI disable control 414 to enable delivery of a subsequently received NMI if the exception was taken within the NMI handler and/or if the preserved NMI disable control 456 indicates that delivery of further NMI was temporarily disabled or deferred at the time of the preservation.

Conversely, the NMI disable control configuration unit 412 is operative in response to and/or as a result of the exception handler return instruction 460 to configure the NMI disable control 414 to enable delivery of a subsequently received NMI if the exception was not taken within an NMI handler and/or if the preserved NMI disable control 456 indicates that delivery of further NMI was enabled at the time of the preservation. Accordingly, the exception handler return execution unit, responsive to the exception handler return instruction, may either enable or not enable the delivery of further NMI based on whether the preserved NMI disable control indicates the exception was or was not received within an NMI. For example, if the preserved NMI disable control has a first value the delivery of further NMI may be enabled, but if the preserved NMI disable control has a second different value the delivery of further NMI may not be enabled and may therefore still be deferred. The execution unit, in response to the exception return instruction, may also perform other conventional operations, such as, for example, restoring architectural state from the exception frame into the architectural state of the processor (e.g., loading a program counter of the processor with the value from the exception frame, loading the flags register of the processor with the values from the exception frame, etc.).

The NMI disable control configuration unit 412 and/or the processor may include specific or particular logic (e.g., transistors, integrated circuitry, or other hardware potentially combined with firmware (e.g., instructions stored in non-volatile memory) and/or software) that is operable to perform the exception handler return instruction and/or configure the NMI disable control in response to and/or as a result of the exception handler return instruction (e.g., in response to one or more instructions or control signals decoded therefrom). In some embodiments, the NMI disable control configuration unit may include one or more input structures (e.g., port(s), interconnect(s), an interface) to receive decoded instructions and associated data, circuitry or logic (e.g., state machines) coupled therewith to receive and process the decoded instructions and associated data, and one or more output structures (e.g., port(s), interconnect(s), an interface) to provide output signals to configure the NMI disable control.

Advantageously, such capability to conditionally enable delivery of further NMI based on whether or not the exception was taken within the NMI handling may help to avoid nesting of NMI and the associated potential problems described elsewhere herein. Moreover, the operating system or any other privileged software does not need to set the NMI disable bit directly, which can impose possible risks in the event of corrupt software. Rather, the delivery of further NMIs may only be permitted to remain disabled when the logic of the processor has already disabled them.

To avoid obscuring the description, a relatively simple processor has been shown and described. However, the processor may optionally include other well-known processor components. Possible examples of such components include, but are not limited to, general-purpose registers, a status register (sometimes called a flags register), a program counter register, a segment register, system control registers, an instruction fetch unit, prefetch buffers, one or more levels of cache (e.g., a level 1 (L1) instruction cache, an L1 data cache, and an L2 data/instruction cache), an instruction translation lookaside buffer (TLB), a data TLB, a branch prediction unit, out-of-order execution units (e.g., an instruction scheduling unit, a register rename and/or allocation unit, an instruction dispatch unit, a reorder buffer (ROB), a reservation station, a memory order buffer, a retirement unit, etc.), a bus interface unit, an address generation unit, a debug unit, a performance monitor unit, a power management unit, external pins, other components included in processors, and various combinations thereof. Such components may be coupled together in various different suitable combinations and/or configurations known in the arts. Embodiments are not limited to any known such combination or configuration. Moreover, embodiments may be included in processors have multiple cores at least one of which is operative to perform an embodiment of an exception handler return instruction as described herein.

Figure 5:
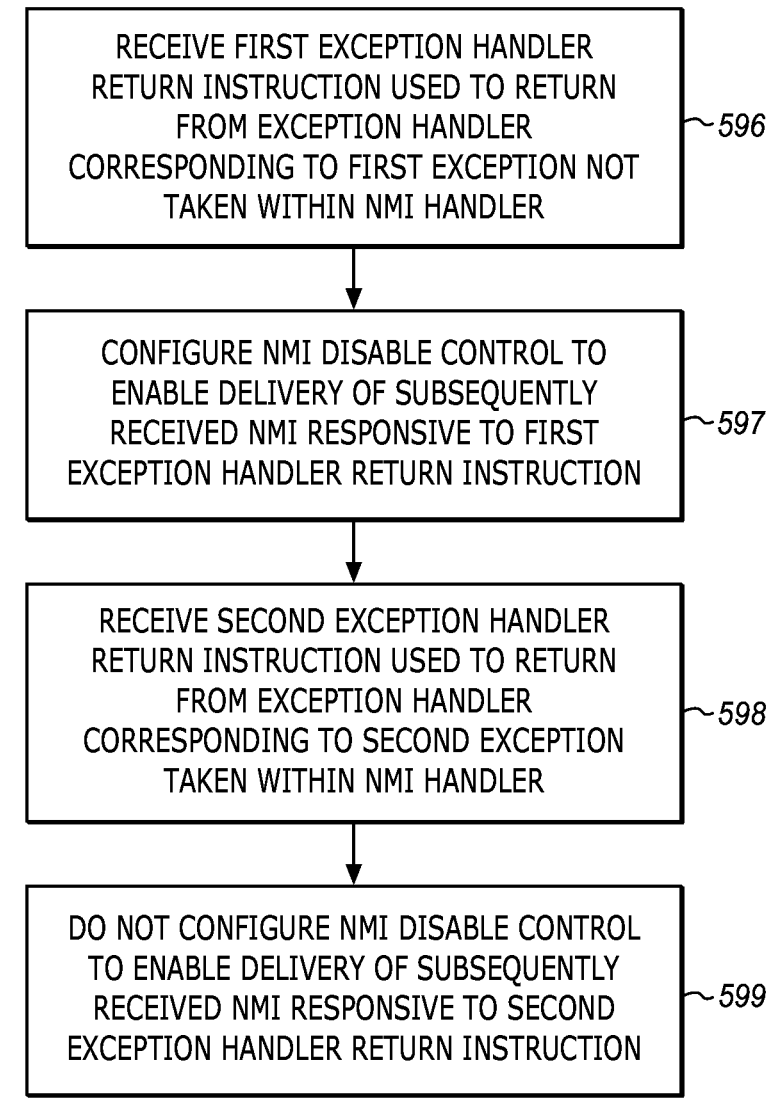
FIG. 5 is a block flow diagram of an embodiment of a method in a processor of performing an embodiment of an exception handler return instruction.

FIG. 5 is a block flow diagram of an embodiment of a method 595 in a processor of performing an embodiment of an exception handler return instruction. In some embodiments, the method 595 may be performed by and/or within the processor 102 of FIG. 1 and/or the processor 402 of FIG. 4. The components, features, and specific optional details described herein for the processors 102, 402, also optionally apply to the method 595. Alternatively, the method 595 may be performed by and/or within a similar or different processor or apparatus. Moreover, the processors 102, 402 may perform methods the same as, similar to, or different than the method 595.

The method includes receiving a first instance of an exception handler return instruction, at block 596. The first exception handler return instruction has been used to return from an exception handler corresponding to a first exception, which in this method was not taken within an NMI handler. The method includes configuring a processor (e.g., through an NMI disable control) to enable delivery of subsequently received NMI responsive to the first exception handler return instruction, at block 597. Since the first exception was not taken within the NMI handler, there is not an outstanding pending NMI currently being serviced such that delivery of subsequent NMI could be prematurely enabled.

The method includes receiving a second instance of an exception handler return instruction, at block 598. Although not shown in the illustration, it is to be appreciated that between blocks 597-598 a number of other events may occur. For example, an NMI may be received, a call to an NMI handler may be made, an exception may be received while in the NMI handler, a call to an exception handler may be made, and then a return from the exception handler may be performed using the second instance of the exception handler return instruction received at block 598. That is, the second instance of the exception handler return instruction has been used to return from an exception handler corresponding to a second exception that was taken within the NMI handler. The method includes not configuring or abstaining from configuring the processor (e.g., through an NMI disable control) to enable delivery of subsequently received NMI responsive to the second exception handler return instruction, at block 599. Advantageously, not configuring the NMI disable control to enable delivery of the subsequently received NMI may help to avoid prematurely enabling NMI and/or nested NMI. Rather, the delivery of the subsequently received NMI may still be deferred until a return from the NMI.

Notice that the exception handler return instruction may have two different behaviors dependent on whether or not the exception being returned from was taken during NMI handling. The method is shown in a relatively basic form. However, operations may be added to and/or removed from the method. In addition, while a particular order of the operations has been shown, that order is exemplary. Other embodiments may perform the operations in a different order, overlap operations, etc.

Figure 6:
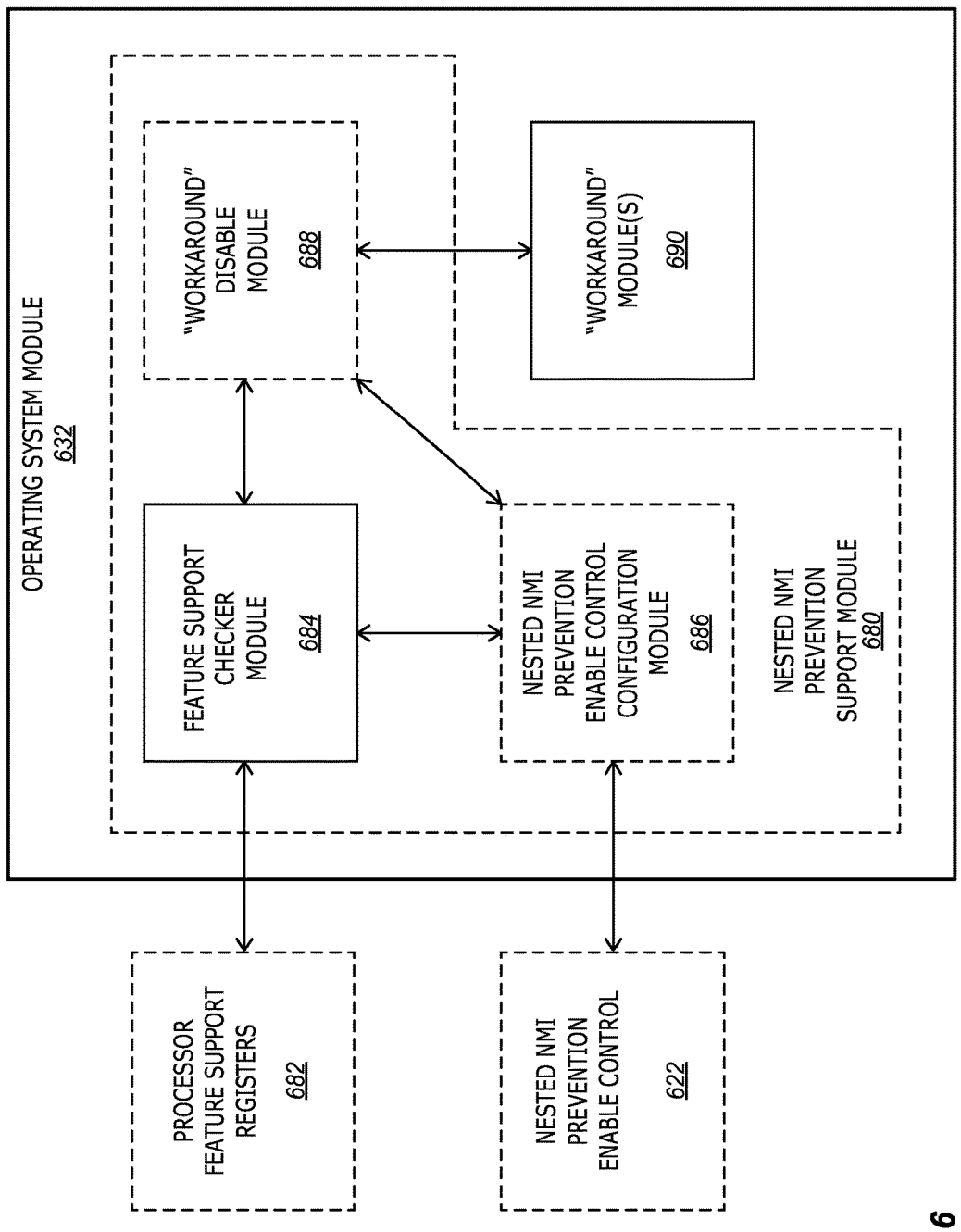
FIG. 6 is a block diagram of an embodiment of an operating system module having an embodiment of a nested NMI prevention support module.

One particular example embodiment of a suitable exception handler return instruction that may be modified to incorporate any of the features shown and described for FIGS. 5-6 is an IRET interrupt return instruction. This instruction can be referred to by the mnemonics IRET, IRETD, and IRETQ, for operands size 16 bits, 32 bits, and 64 bits, respectively. Most assemblers use the IRET mnemonic interchangeably for all operand sizes. Software may use this instruction to return program control from an exception or interrupt handler to a program or procedure that was interrupted by an exception, an external interrupt, or a software-generated interrupt. The instruction may also be used to perform a return from a nested task. A nested task may be created when a CALL instruction is used to initiate a task switch or when an interrupt or exception causes a task switch to an interrupt or exception handler. In real-address mode, the IRET instruction performs a far return to the interrupted program or procedure. During this operation, the processor pops the return instruction pointer, return code segment selector, and EFLAGS image from the stack to the extended instruction pointer (EIP), code segment selector (CS), and flags (EFLAGS) registers, respectively, and then resumes execution of the interrupted program or procedure. In protected mode, the action of the IRET instruction depends on the settings of the NT (nested task) and VM (virtual-8086 mode) flags in the EFLAGS register; the current privilege level (CPL) from the RPL field of the code segment selector; the VM flag in the EFLAGS image stored on the current stack; and the RPL field of the code segment selector on the current stack. Depending on these values, the processor performs one of the following types of interrupt returns: (1) return from virtual-8086 mode; (2) return to virtual-8086 mode; (3) intra-privilege level return; (4) inter-privilege level return; (5) return from nested task (task switch).

If the NT flag (e.g., in the EFLAGS register) is cleared, the IRET instruction performs a far return from the interrupt procedure, without a task switch. The code segment being returned to is generally equally or less privileged than the interrupt handler routine (e.g., as indicated by the RPL field of the code segment selector popped from the stack). As with a real-address mode interrupt return, the IRET instruction pops the return instruction pointer, the return code segment selector, and EFLAGS image from the stack to the extended instruction pointer, code segment selector, and EFLAGS registers, respectively, and then resumes execution of the interrupted program or procedure. If the return is to another privilege level, or if the return is from 64-bit mode, the IRET instruction also pops the stack pointer and segment selector from the stack, before resuming program execution. If the return is to virtual-8086 mode, the processor also pops the data segment selectors from the stack.

If the NT flag (e.g., in the EFLAGS register) is set, the IRET instruction performs a task switch (return) from a nested task (a task called with a CALL instruction, an interrupt, or an exception) back to the calling or interrupted task. The updated state of the task executing the IRET instruction is saved in its TSS. If the task is re-entered later, the code that follows the IRET instruction is executed. If the NT flag is set and the processor is in IA-32e mode, the IRET instruction may cause a general protection exception.

If NMIs are blocked, execution of the IRET instruction unblocks NMIs. This unblocking occurs even if the instruction causes a fault. In such a case, NMIs are unmasked before the exception handler is invoked.

FIG. 6 is a block diagram of an embodiment of an operating system module 632 having an embodiment of a nested NMI prevention support module 680. The nested NMI prevention support module includes a processor feature support checker module 684. The processor feature support checker module may be coupled with, or otherwise in communication with, one or more processor feature support registers 682 of a processor. Processors commonly have one or more feature support and/or identification registers that are used to specify the features and capabilities of the processor. The processor feature support checker module may be operative to check or determine whether or not the processor has support for a nested NMI prevention mechanism/capability. For example, the processor feature support checker module may issue a processor feature identification instruction (e.g., a CPUID instruction, or the like) to perform this check.

The nested NMI prevention support module may optionally include a nested NMI prevention enable control configuration module 686. The nested NMI prevention enable control configuration module is coupled with, or otherwise in communication with, a nested NMI prevention enable control 622 of the processor (e.g., the nested NMI prevention enable control 122). By way of example, the nested NMI prevention enable control may be found in a model-specific register, a control or configuration register of the processor, or the like. In one aspect, the nested NMI prevention enable control may represent a privileged-level control capable of being modified by the operating system or other privileged-level software but not by unprivileged or application-level software. If the processor has support for the nested NMI prevention mechanism/capability, then the configuration module 686 may optionally configure the nested NMI prevention enable control 622 to enable this mechanism/capability. Alternatively, it could be determined for some reason not to enable this mechanism/capability.

The nested NMI prevention support module may also optionally include a "workaround" disable module 688. The workaround disable module is coupled with, or otherwise in communication with, one or more workaround modules 690 of the operating system module. These workaround modules may represent any of various approaches known in the arts to attempt to handle or avoid problems associated with nested NMI handling. By way of example, the workaround modules may be operative to take steps in each exception handler to detect nesting inside an NMI handler and avoid executing a return instruction (e.g., an IRET instruction). They may be operative to mitigate or eliminate the effects, if an unwanted nested interrupt was to actually be delivered, such as special stack handling. Generally, such workarounds incur a cost in terms of complexity and/or performance. In some embodiments, when the nested NMI prevention mechanism/capability is enabled, as described elsewhere herein, the workaround disable module may optionally disable one or more of these workaround modules, although this is not required.

While embodiments described herein have been described primarily for NMI, other embodiments may be used for other types of interrupts. For example, embodiments are applicable to system management interrupts (SMI) and/or other relatively high priority interrupts (e.g., as high a priority or a higher priority than NMI). Examples of possible causes of an SMI include, but are not limited to, a component (e.g., a chipset, hardware on a motherboard) signaling an SMI on a designated SMI pin, a software SMI caused by system software due to an input/output access to a particular location considered special by the system hardware, and the like. Such an SMI may allow entry into a System Management Mode (SMM). SMM may represent a different and isolated operating mode or execution environment in which normal execution including the operation of the operating system is temporarily suspended, and an SMI handler and/or other SMM code (e.g., firmware (e.g., of the basic input-output system (BIOS) and/or software) may be performed in a high-privilege mode transparently to the operating system and user-level applications. Representatively, the SMM code commonly executes from an address space that is inaccessible to other operating modes of the processor.

As stated earlier, it is generally desirable to prevent prematurely re-enable the delivery of a subsequent NMI, which may cause operating system instability and/or potentially fatal errors, since the processing of the NMI may rely on task gates, interrupt stack table (IST) or other features of the processor that are not fully compatible with nested NMI. In certain systems, SMIs may be handled by SMI handlers implemented in firmware (e.g., the BIOS), whereas most or all other interrupts, including NMIs, are typically handled by the operating system. For that reason, it is generally desirable to defer the delivery of NMIs while the SMI handler (e.g., in the BIOS and/or firmware) is operating to handle the SMI. To support this, certain processors may enable or configure the temporary deferral or blocking of NMIs when delivering an SMI. If an exception is taken while handling an SMI (e.g., while a SMI handler is handling the SMI and before the SMI handler returns), then the exception handler when it returns may prematurely re-enable the delivery of subsequent NMI. This may result in a subsequent NMI being delivered during the handling of the SMI to the BIOS/firmware (i.e., not to the operating system) when it should instead be delivered to the operating system (e.g., an NMI handler). In some embodiments, an instruction (e.g., a BIOS exception handler return instruction) may return from a BIOS exception handler without prematurely re-enabling the delivery of NMIs using techniques analogous to those disclosed herein. In addition, other architectures may have other types of high priority interrupts similar to SMI that those skilled in the art will appreciate that embodiments described herein are applicable to.

Exemplary Core Architectures, Processors, and Computer Architectures

Processor cores may be implemented in different ways, for different purposes, and in different processors. For instance, implementations of such cores may include: 1) a general purpose in-order core intended for general-purpose computing; 2) a high performance general purpose out-of-order core intended for general-purpose computing; 3) a special purpose core intended primarily for graphics and/or scientific (throughput) computing. Implementations of different processors may include: 1) a CPU including one or more general purpose in-order cores intended for general-purpose computing and/or one or more general purpose out-of-order cores intended for general-purpose computing; and 2) a coprocessor including one or more special purpose cores intended primarily for graphics and/or scientific (throughput). Such different processors lead to different computer system architectures, which may include: 1) the coprocessor on a separate chip from the CPU; 2) the coprocessor on a separate die in the same package as a CPU; 3) the coprocessor on the same die as a CPU (in which case, such a coprocessor is sometimes referred to as special purpose logic, such as integrated graphics and/or scientific (throughput) logic, or as special purpose cores); and 4) a system on a chip that may include on the same die the described CPU (sometimes referred to as the application core(s) or application processor(s)), the above described coprocessor, and additional functionality. Exemplary core architectures are described next, followed by descriptions of exemplary processors and computer architectures.

Exemplary Core Architectures

In-Order and Out-of-Order Core Block Diagram

Figure 7:
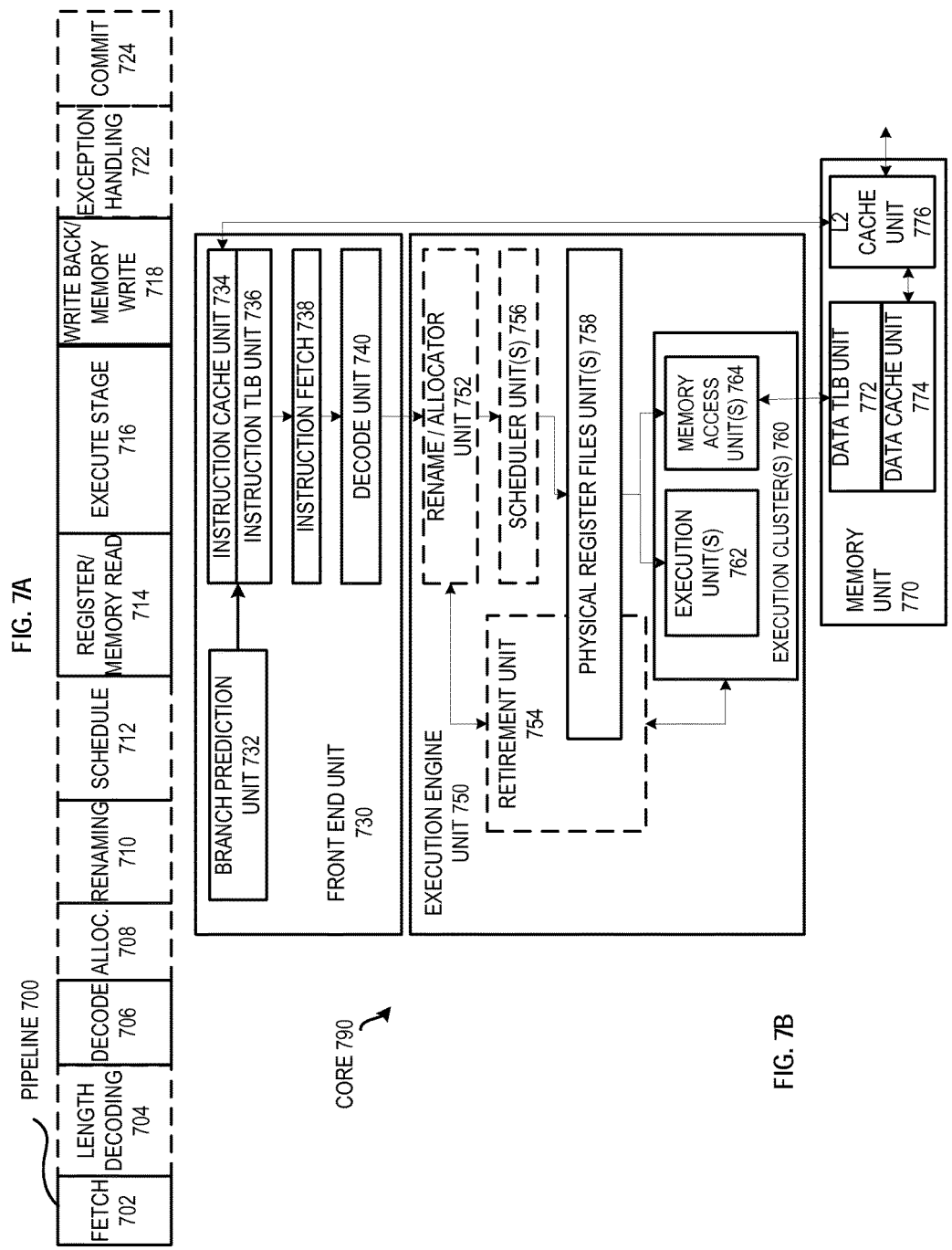
FIG. 7A is a block diagram illustrating an embodiment of an in-order pipeline and an embodiment of a register renaming out-of-order issue/execution pipeline.
FIG. 7B is a block diagram of an embodiment of processor core including a front end unit coupled to an execution engine unit and both coupled to a memory unit.

FIG. 7A is a block diagram illustrating both an exemplary in-order pipeline and an exemplary register renaming, out-of-order issue/execution pipeline according to embodiments of the invention. FIG. 7B is a block diagram illustrating both an exemplary embodiment of an in-order architecture core and an exemplary register renaming, out-of-order issue/execution architecture core to be included in a processor according to embodiments of the invention. The solid lined boxes in FIGS. 7A-B illustrate the in-order pipeline and in-order core, while the optional addition of the dashed lined boxes illustrates the register renaming, out-of-order issue/execution pipeline and core. Given that the in-order aspect is a subset of the out-of-order aspect, the out-of-order aspect will be described.

In FIG. 7A, a processor pipeline 700 includes a fetch stage 702, a length decode stage 704, a decode stage 706, an allocation stage 708, a renaming stage 710, a scheduling (also known as a dispatch or issue) stage 712, a register read/memory read stage 714, an execute stage 716, a write back/memory write stage 718, an exception handling stage 722, and a commit stage 724.

FIG. 7B shows processor core 790 including a front end unit 730 coupled to an execution engine unit 750, and both are coupled to a memory unit 770. The core 790 may be a reduced instruction set computing (RISC) core, a complex instruction set computing (CISC) core, a very long instruction word (VLIW) core, or a hybrid or alternative core type. As yet another option, the core 790 may be a special-purpose core, such as, for example, a network or communication core, compression engine, coprocessor core, general purpose computing graphics processing unit (GPGPU) core, graphics core, or the like.

The front end unit 730 includes a branch prediction unit 732 coupled to an instruction cache unit 734, which is coupled to an instruction translation lookaside buffer (TLB) 736, which is coupled to an instruction fetch unit 738, which is coupled to a decode unit 740. The decode unit 740 (or decoder) may decode instructions, and generate as an output one or more micro-operations, micro-code entry points, microinstructions, other instructions, or other control signals, which are decoded from, or which otherwise reflect, or are derived from, the original instructions. The decode unit 740 may be implemented using various different mechanisms. Examples of suitable mechanisms include, but are not limited to, look-up tables, hardware implementations, programmable logic arrays (PLAs), microcode read only memories (ROMs), etc. In one embodiment, the core 790 includes a microcode ROM or other medium that stores microcode for certain macroinstructions (e.g., in decode unit 740 or otherwise within the front end unit 730). The decode unit 740 is coupled to a rename/allocator unit 752 in the execution engine unit 750.

The execution engine unit 750 includes the rename/allocator unit 752 coupled to a retirement unit 754 and a set of one or more scheduler unit(s) 756. The scheduler unit(s) 756 represents any number of different schedulers, including reservations stations, central instruction window, etc. The scheduler unit(s) 756 is coupled to the physical register file(s) unit(s) 758. Each of the physical register file(s) units 758 represents one or more physical register files, different ones of which store one or more different data types, such as scalar integer, scalar floating point, packed integer, packed floating point, vector integer, vector floating point, status (e.g., an instruction pointer that is the address of the next instruction to be executed), etc. In one embodiment, the physical register file(s) unit 758 comprises a vector registers unit, a write mask registers unit, and a scalar registers unit. These register units may provide architectural vector registers, vector mask registers, and general purpose registers. The physical register file(s) unit(s) 758 is overlapped by the retirement unit 754 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.). The retirement unit 754 and the physical register file(s) unit(s) 758 are coupled to the execution cluster(s) 760. The execution cluster(s) 760 includes a set of one or more execution units 762 and a set of one or more memory access units 764. The execution units 762 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. The scheduler unit(s) 756, physical register file(s) unit(s) 758, and execution cluster(s) 760 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 764). It should also be understood that where separate pipelines are used, one or more of these pipelines may be out-of-order issue/execution and the rest in-order.

The set of memory access units 764 is coupled to the memory unit 770, which includes a data TLB unit 772 coupled to a data cache unit 774 coupled to a level 2 (L2) cache unit 776. In one exemplary embodiment, the memory access units 764 may include a load unit, a store address unit, and a store data unit, each of which is coupled to the data TLB unit 772 in the memory unit 770. The instruction cache unit 734 is further coupled to a level 2 (L2) cache unit 776 in the memory unit 770. The L2 cache unit 776 is coupled to one or more other levels of cache and eventually to a main memory.

By way of example, the exemplary register renaming, out-of-order issue/execution core architecture may implement the pipeline 700 as follows: 1) the instruction fetch 738 performs the fetch and length decoding stages 702 and 704; 2) the decode unit 740 performs the decode stage 706; 3) the rename/allocator unit 752 performs the allocation stage 708 and renaming stage 710; 4) the scheduler unit(s) 756 performs the schedule stage 712; 5) the physical register file(s) unit(s) 758 and the memory unit 770 perform the register read/memory read stage 714; the execution cluster 760 perform the execute stage 716; 6) the memory unit 770 and the physical register file(s) unit(s) 758 perform the write back/memory write stage 718; 7) various units may be involved in the exception handling stage 722; and 8) the retirement unit 754 and the physical register file(s) unit(s) 758 perform the commit stage 724.

The core 790 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.), including the instruction(s) described herein. In one embodiment, the core 790 includes logic to support a packed data instruction set extension (e.g., AVX1, AVX2), thereby allowing the operations used by many multimedia applications to be performed using packed data.

It should be understood that the core may support multi-threading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes separate instruction and data cache units 734/774 and a shared L2 cache unit 776, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

Specific Exemplary In-Order Core Architecture

Figure 8:
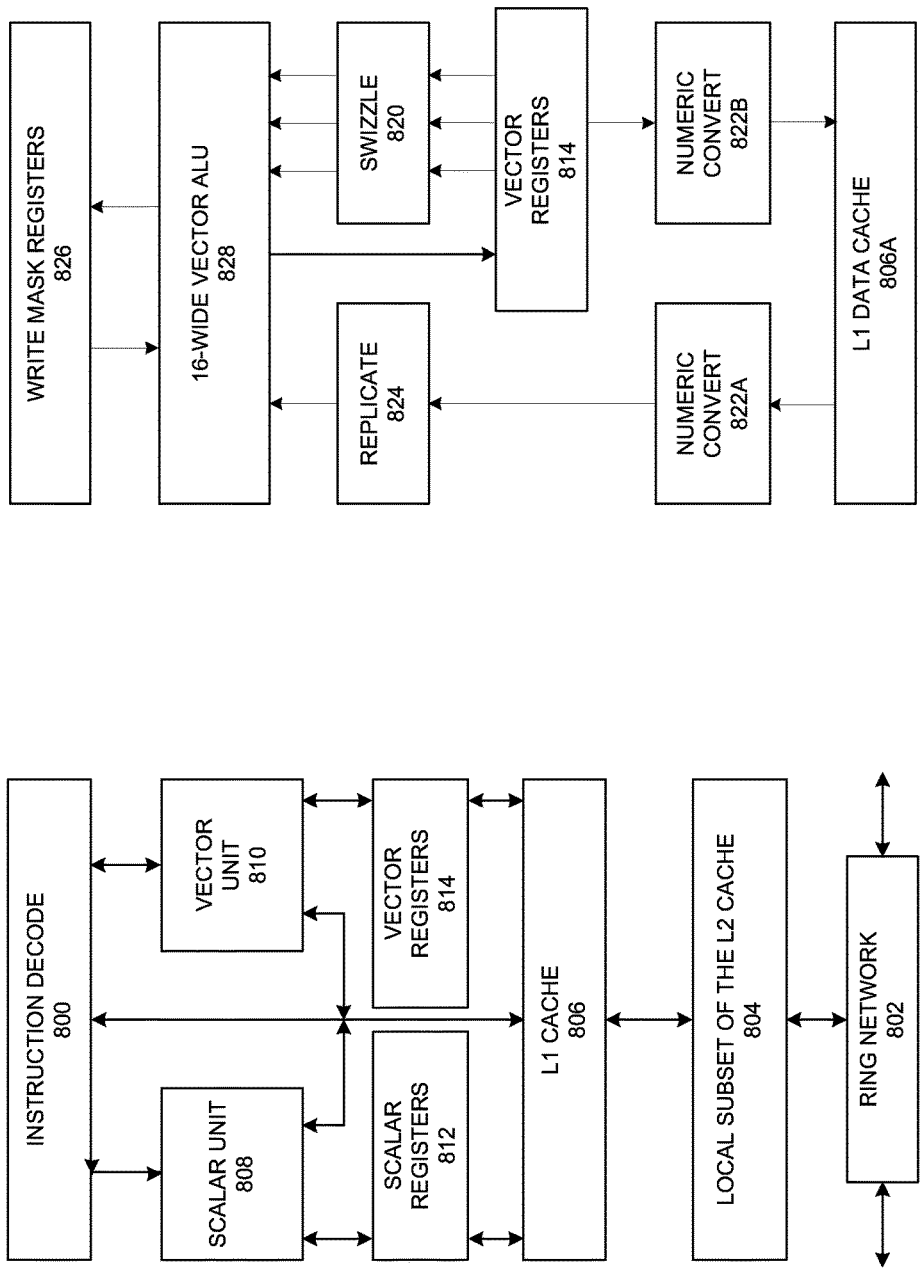
FIG. 8A is a block diagram of an embodiment of a single processor core, along with its connection to the on-die interconnect network, and with its local subset of the Level 2 (L2) cache.
FIG. 8B is a block diagram of an embodiment of an expanded view of part of the processor core of FIG. 8A.

FIGS. 8A-B illustrate a block diagram of a more specific exemplary in-order core architecture, which core would be one of several logic blocks (including other cores of the same type and/or different types) in a chip. The logic blocks communicate through a high-bandwidth interconnect network (e.g., a ring network) with some fixed function logic, memory I/O interfaces, and other necessary I/O logic, depending on the application.

FIG. 8A is a block diagram of a single processor core, along with its connection to the on-die interconnect network 802 and with its local subset of the Level 2 (L2) cache 804, according to embodiments of the invention. In one embodiment, an instruction decoder 800 supports the x86 instruction set with a packed data instruction set extension. An L1 cache 806 allows low-latency accesses to cache memory into the scalar and vector units. While in one embodiment (to simplify the design), a scalar unit 808 and a vector unit 810 use separate register sets (respectively, scalar registers 812 and vector registers 814) and data transferred between them is written to memory and then read back in from a level 1 (L1) cache 806, alternative embodiments of the invention may use a different approach (e.g., use a single register set or include a communication path that allow data to be transferred between the two register files without being written and read back).

The local subset of the L2 cache 804 is part of a global L2 cache that is divided into separate local subsets, one per processor core. Each processor core has a direct access path to its own local subset of the L2 cache 804. Data read by a processor core is stored in its L2 cache subset 804 and can be accessed quickly, in parallel with other processor cores accessing their own local L2 cache subsets. Data written by a processor core is stored in its own L2 cache subset 804 and is flushed from other subsets, if necessary. The ring network ensures coherency for shared data. The ring network is bi-directional to allow agents such as processor cores, L2 caches and other logic blocks to communicate with each other within the chip. Each ring data-path is 1012-bits wide per direction.

FIG. 8B is an expanded view of part of the processor core in FIG. 8A according to embodiments of the invention. FIG. 8B includes an L1 data cache 806A part of the L1 cache 804, as well as more detail regarding the vector unit 810 and the vector registers 814. Specifically, the vector unit 810 is a 16-wide vector processing unit (VPU) (see the 16-wide ALU 828), which executes one or more of integer, single-precision float, and double-precision float instructions. The VPU supports swizzling the register inputs with swizzle unit 820, numeric conversion with numeric convert units 822A-B, and replication with replication unit 824 on the memory input. Write mask registers 826 allow predicating resulting vector writes.

Processor with Integrated Memory Controller and Graphics

Figure 9:
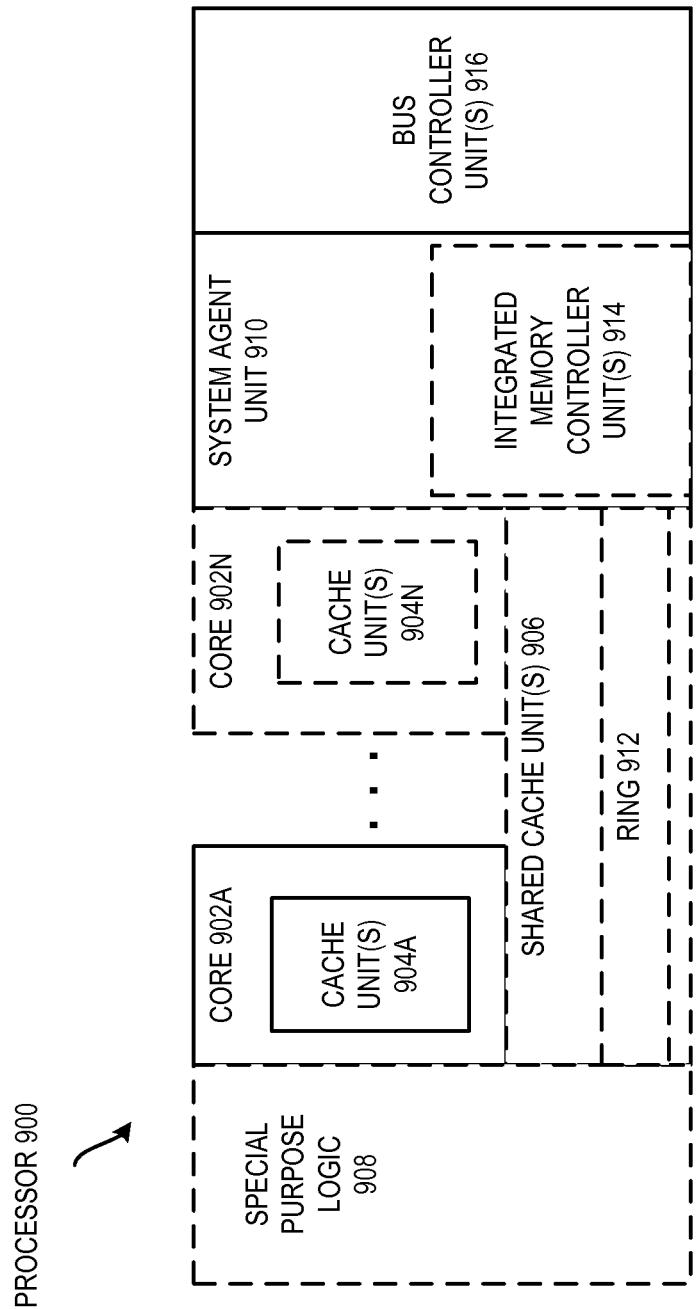
FIG. 9 is a block diagram of an embodiment of a processor that may have more than one core, may have an integrated memory controller, and may have integrated graphics.

FIG. 9 is a block diagram of a processor 900 that may have more than one core, may have an integrated memory controller, and may have integrated graphics according to embodiments of the invention. The solid lined boxes in FIG. 9 illustrate a processor 900 with a single core 902A, a system agent 910, a set of one or more bus controller units 916, while the optional addition of the dashed lined boxes illustrates an alternative processor 900 with multiple cores 902A-N, a set of one or more integrated memory controller unit(s) 914 in the system agent unit 910, and special purpose logic 908.

Thus, different implementations of the processor 900 may include: 1) a CPU with the special purpose logic 908 being integrated graphics and/or scientific (throughput) logic (which may include one or more cores), and the cores 902A-N being one or more general purpose cores (e.g., general purpose in-order cores, general purpose out-of-order cores, a combination of the two); 2) a coprocessor with the cores 902A-N being a large number of special purpose cores intended primarily for graphics and/or scientific (throughput); and 3) a coprocessor with the cores 902A-N being a large number of general purpose in-order cores. Thus, the processor 900 may be a general-purpose processor, coprocessor or special-purpose processor, such as, for example, a network or communication processor, compression engine, graphics processor, GPGPU (general purpose graphics processing unit), a high-throughput many integrated core (MIC) coprocessor (including 30 or more cores), embedded processor, or the like. The processor may be implemented on one or more chips. The processor 900 may be a part of and/or may be implemented on one or more substrates using any of a number of process technologies, such as, for example, BiCMOS, CMOS, or NMOS.

The memory hierarchy includes one or more levels of cache within the cores, a set or one or more shared cache units 906, and external memory (not shown) coupled to the set of integrated memory controller units 914. The set of shared cache units 906 may include one or more mid-level caches, such as level 2 (L2), level 3 (L3), level 4 (L4), or other levels of cache, a last level cache (LLC), and/or combinations thereof. While in one embodiment a ring based interconnect unit 912 interconnects the integrated graphics logic 908, the set of shared cache units 906, and the system agent unit 910/integrated memory controller unit(s) 914, alternative embodiments may use any number of well-known techniques for interconnecting such units. In one embodiment, coherency is maintained between one or more cache units 906 and cores 902-A-N.

In some embodiments, one or more of the cores 902A-N are capable of multi-threading. The system agent 910 includes those components coordinating and operating cores 902A-N. The system agent unit 910 may include for example a power control unit (PCU) and a display unit. The PCU may be or include logic and components needed for regulating the power state of the cores 902A-N and the integrated graphics logic 908. The display unit is for driving one or more externally connected displays.

The cores 902A-N may be homogenous or heterogeneous in terms of architecture instruction set; that is, two or more of the cores 902A-N may be capable of execution the same instruction set, while others may be capable of executing only a subset of that instruction set or a different instruction set.

Exemplary Computer Architectures

FIGS. 10-13 are block diagrams of exemplary computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Figure 10:
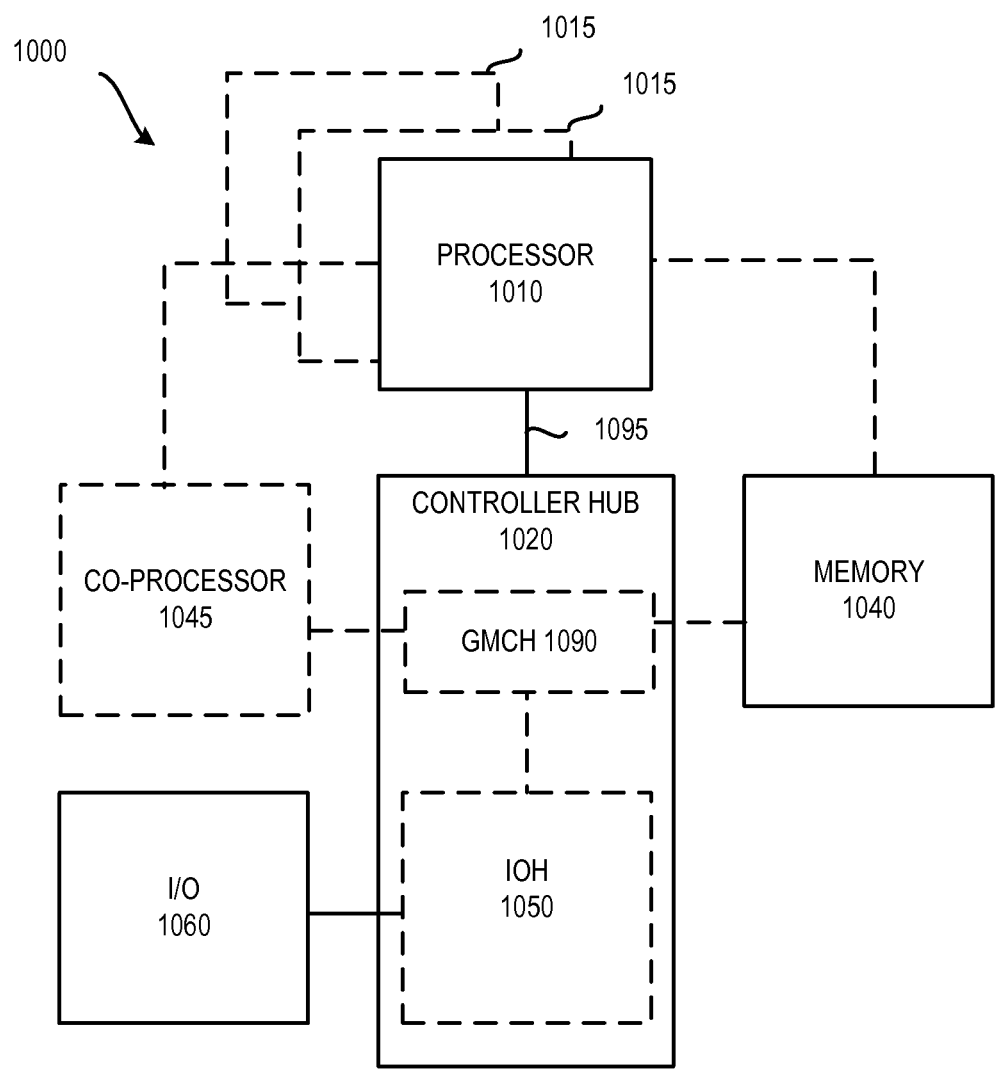
FIG. 10 is a block diagram of a first embodiment of a computer architecture.

Referring now to FIG. 10, shown is a block diagram of a system 1000 in accordance with one embodiment of the present invention. The system 1000 may include one or more processors 1010, 1015, which are coupled to a controller hub 1020. In one embodiment the controller hub 1020 includes a graphics memory controller hub (GMCH) 1090 and an Input/Output Hub (IOH) 1050 (which may be on separate chips); the GMCH 1090 includes memory and graphics controllers to which are coupled memory 1040 and a coprocessor 1045; the IOH 1050 is couples input/output (I/O) devices 1060 to the GMCH 1090. Alternatively, one or both of the memory and graphics controllers are integrated within the processor (as described herein), the memory 1040 and the coprocessor 1045 are coupled directly to the processor 1010, and the controller hub 1020 in a single chip with the IOH 1050.

The optional nature of additional processors 1015 is denoted in FIG. 10 with broken lines. Each processor 1010, 1015 may include one or more of the processing cores described herein and may be some version of the processor 900.

The memory 1040 may be, for example, dynamic random access memory (DRAM), phase change memory (PCM), or a combination of the two. For at least one embodiment, the controller hub 1020 communicates with the processor(s) 1010, 1015 via a multi-drop bus, such as a frontside bus (FSB), point-to-point interface such as QuickPath Interconnect (QPI), or similar connection 1095.

In one embodiment, the coprocessor 1045 is a special-purpose processor, such as, for example, a high-throughput MIC processor, a network or communication processor, compression engine, graphics processor, GPGPU, embedded processor, or the like. In one embodiment, controller hub 1020 may include an integrated graphics accelerator.

There can be a variety of differences between the physical resources 1010, 1015 in terms of a spectrum of metrics of merit including architectural, microarchitectural, thermal, power consumption characteristics, and the like.

In one embodiment, the processor 1010 executes instructions that control data processing operations of a general type. Embedded within the instructions may be coprocessor instructions. The processor 1010 recognizes these coprocessor instructions as being of a type that should be executed by the attached coprocessor 1045. Accordingly, the processor 1010 issues these coprocessor instructions (or control signals representing coprocessor instructions) on a coprocessor bus or other interconnect, to coprocessor 1045. Coprocessor (s) 1045 accept and execute the received coprocessor instructions.

Figure 11:
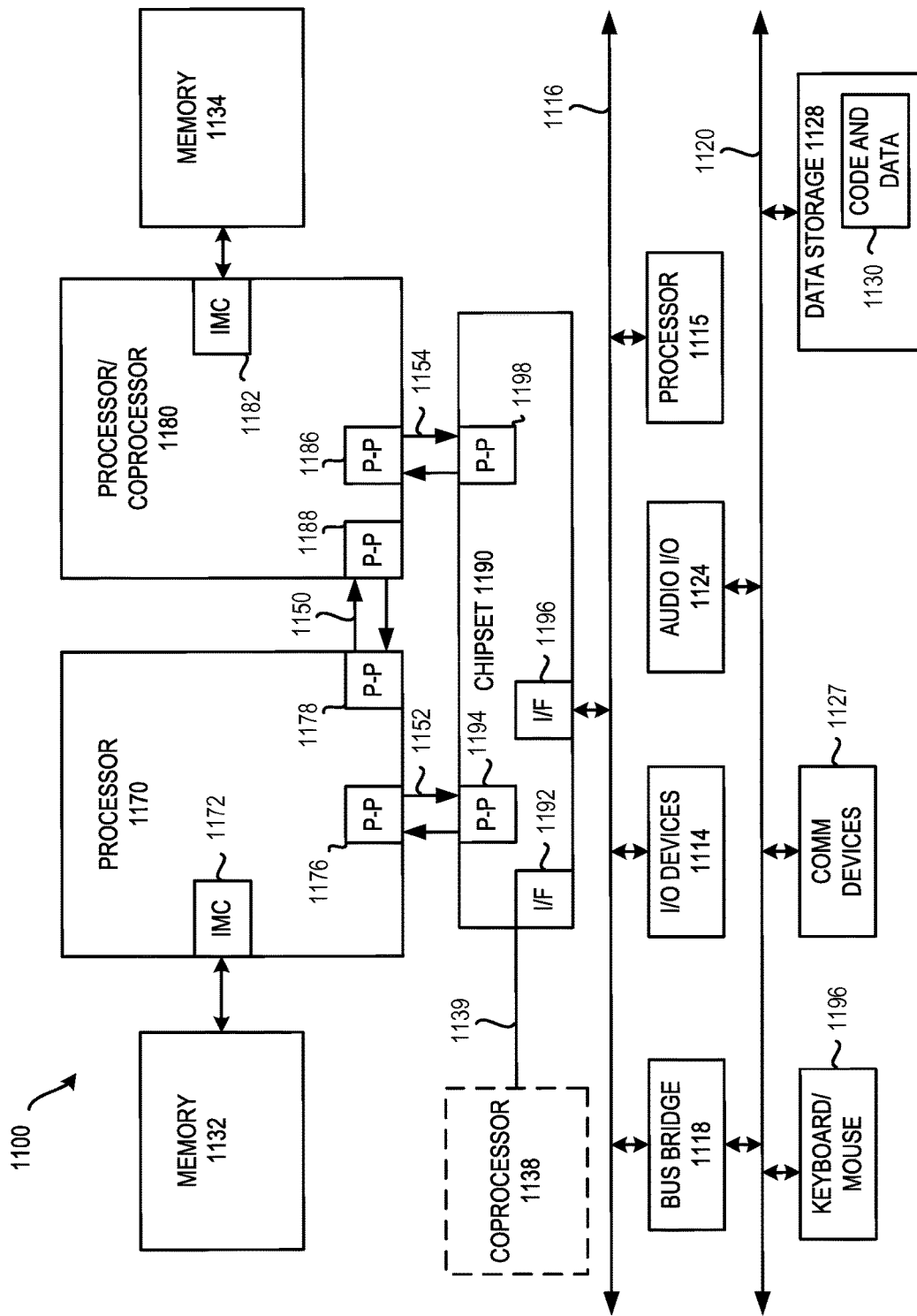
FIG. 11 is a block diagram of a second embodiment of a computer architecture.

Referring now to FIG. 11, shown is a block diagram of a first more specific exemplary system 1100 in accordance with an embodiment of the present invention. As shown in FIG. 11, multiprocessor system 1100 is a point-to-point interconnect system, and includes a first processor 1170 and a second processor 1180 coupled via a point-to-point interconnect 1150. Each of processors 1170 and 1180 may be some version of the processor 900. In one embodiment of the invention, processors 1170 and 1180 are respectively processors 1010 and 1015, while coprocessor 1138 is coprocessor 1045. In another embodiment, processors 1170 and 1180 are respectively processor 1010 coprocessor 1045.

Processors 1170 and 1180 are shown including integrated memory controller (IMC) units 1172 and 1182, respectively. Processor 1170 also includes as part of its bus controller units point-to-point (P-P) interfaces 1176 and 1178; similarly, second processor 1180 includes P-P interfaces 1186 and 1188. Processors 1170, 1180 may exchange information via a point-to-point (P-P) interface 1150 using P-P interface circuits 1178, 1188. As shown in FIG. 11, IMCs 1172 and 1182 couple the processors to respective memories, namely a memory 1132 and a memory 1134, which may be portions of main memory locally attached to the respective processors.

Processors 1170, 1180 may each exchange information with a chipset 1190 via individual P-P interfaces 1152, 1154 using point to point interface circuits 1176, 1194, 1186, 1198. Chipset 1190 may optionally exchange information with the coprocessor 1138 via a high-performance interface 1139. In one embodiment, the coprocessor 1138 is a special-purpose processor, such as, for example, a high-throughput MIC processor, a network or communication processor, compression engine, graphics processor, GPGPU, embedded processor, or the like.

A shared cache (not shown) may be included in either processor or outside of both processors, yet connected with the processors via P-P interconnect, such that either or both processors' local cache information may be stored in the shared cache if a processor is placed into a low power mode.

Chipset 1190 may be coupled to a first bus 1116 via an interface 1196. In one embodiment, first bus 1116 may be a Peripheral Component Interconnect (PCI) bus, or a bus such as a PCI Express bus or another third generation I/O interconnect bus, although the scope of the present invention is not so limited.

As shown in FIG. 11, various I/O devices 1114 may be coupled to first bus 1116, along with a bus bridge 1118 which couples first bus 1116 to a second bus 1120. In one embodiment, one or more additional processor(s) 1115, such as coprocessors, high-throughput MIC processors, GPGPU's, accelerators (such as, e.g., graphics accelerators or digital signal processing (DSP) units), field programmable gate arrays, or any other processor, are coupled to first bus 1116. In one embodiment, second bus 1120 may be a low pin count (LPC) bus. Various devices may be coupled to a second bus 1120 including, for example, a keyboard and/or mouse 1122, communication devices 1127 and a storage unit 1128 such as a disk drive or other mass storage device which may include instructions/code and data 1130, in one embodiment. Further, an audio I/O 1124 may be coupled to the second bus 1120. Note that other architectures are possible. For example, instead of the point-to-point architecture of FIG. 11, a system may implement a multi-drop bus or other such architecture.

Figure 12:
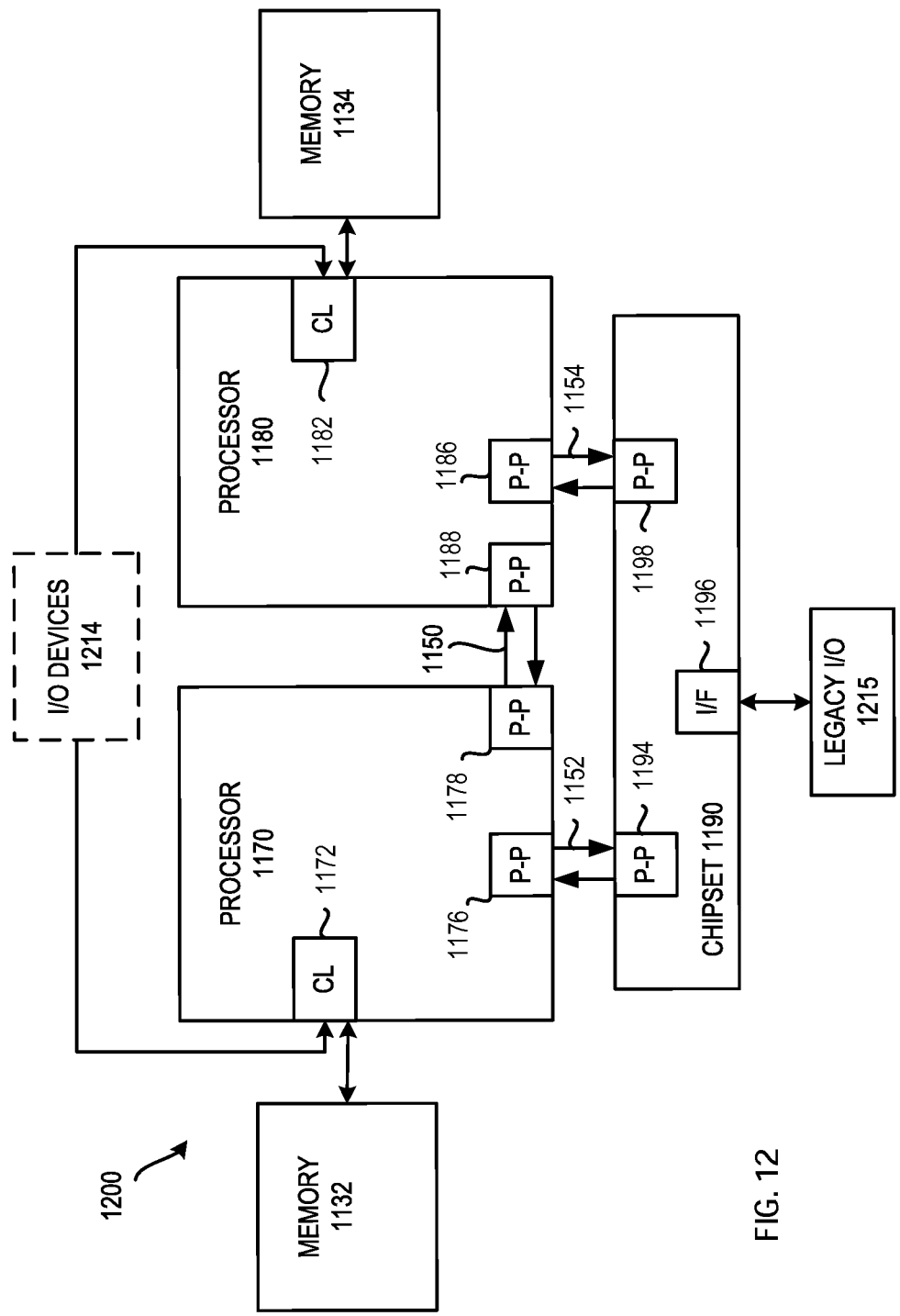
FIG. 12 is a block diagram of a third embodiment of a computer architecture.

Referring now to FIG. 12, shown is a block diagram of a second more specific exemplary system 1200 in accordance with an embodiment of the present invention. Like elements in FIGS. 11 and 12 bear like reference numerals, and certain aspects of FIG. 11 have been omitted from FIG. 12 in order to avoid obscuring other aspects of FIG. 12.

FIG. 12 illustrates that the processors 1170, 1180 may include integrated memory and I/O control logic ("CL") 1172 and 1182, respectively. Thus, the CL 1172, 1182 include integrated memory controller units and include I/O control logic. FIG. 12 illustrates that not only are the memories 1132, 1134 coupled to the CL 1172, 1182, but also that I/O devices 1214 are also coupled to the control logic 1172, 1182. Legacy I/O devices 1215 are coupled to the chip set 1190.

Figure 13:
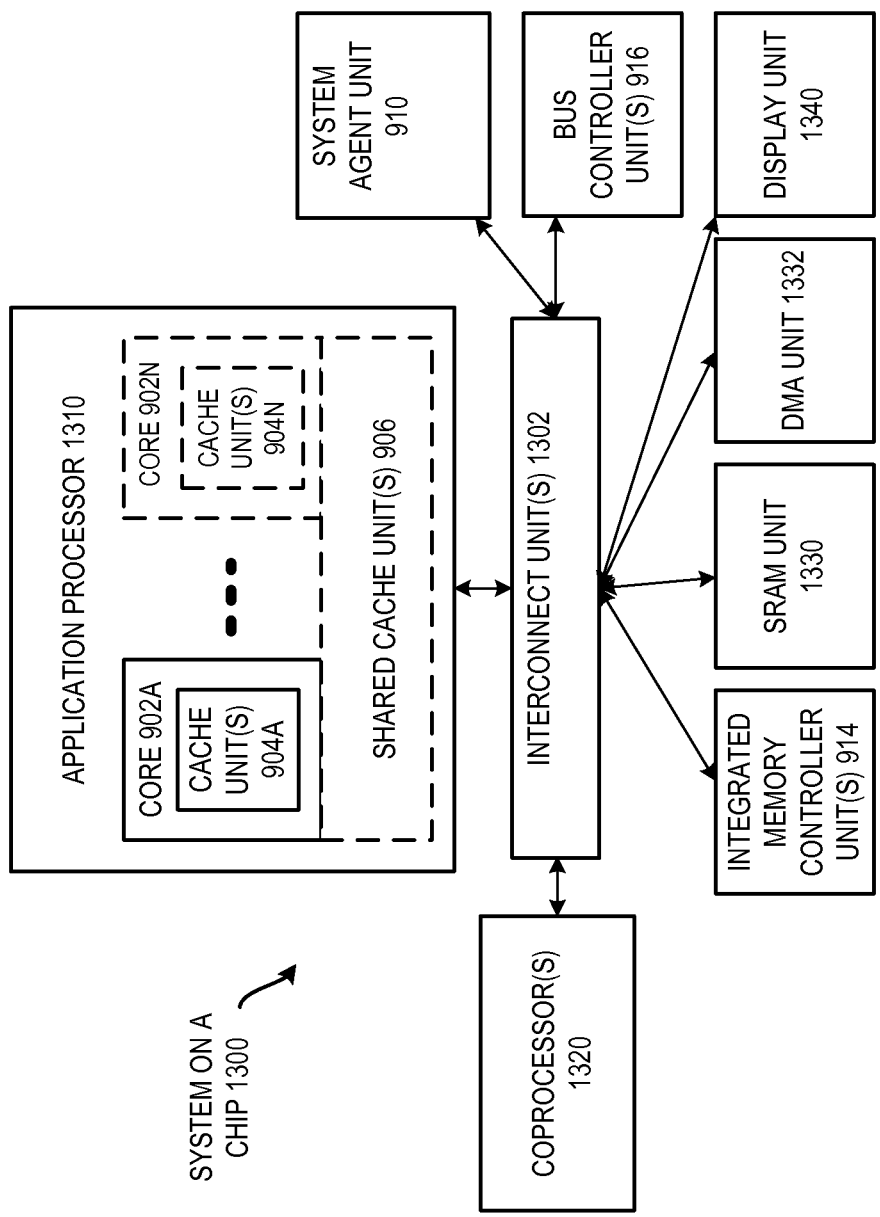
FIG. 13 is a block diagram of an embodiment of a system-on-a-chip architecture.

Referring now to FIG. 13, shown is a block diagram of a SoC 1300 in accordance with an embodiment of the present invention. Similar elements in FIG. 9 bear like reference numerals. Also, dashed lined boxes are optional features on more advanced SoCs. In FIG. 13, an interconnect unit(s) 1302 is coupled to: an application processor 1310 which includes a set of one or more cores 202A-N and shared cache unit(s) 906; a system agent unit 910; a bus controller unit(s) 916; an integrated memory controller unit(s) 914; a set or one or more coprocessors 1320 which may include integrated graphics logic, an image processor, an audio processor, and a video processor; an static random access memory (SRAM) unit 1330; a direct memory access (DMA) unit 1332; and a display unit 1340 for coupling to one or more external displays. In one embodiment, the coprocessor(s) 1320 include a special-purpose processor, such as, for example, a network or communication processor, compression engine, GPGPU, a high-throughput MIC processor, embedded processor, or the like.

Embodiments of the mechanisms disclosed herein may be implemented in hardware, software, firmware, or a combination of such implementation approaches. Embodiments of the invention may be implemented as computer programs or program code executing on programmable systems comprising at least one processor, a storage system (including volatile and non-volatile memory and/or storage elements), at least one input device, and at least one output device.

Program code, such as code 1130 illustrated in FIG. 11, may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritable's (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions.

Accordingly, embodiments of the invention also include non-transitory, tangible machine-readable media containing instructions or containing design data, such as Hardware Description Language (HDL), which defines structures, circuits, apparatuses, processors and/or system features described herein. Such embodiments may also be referred to as program products.

Emulation (Including Binary Translation, Code Morphing, Etc.)

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

Figure 14:
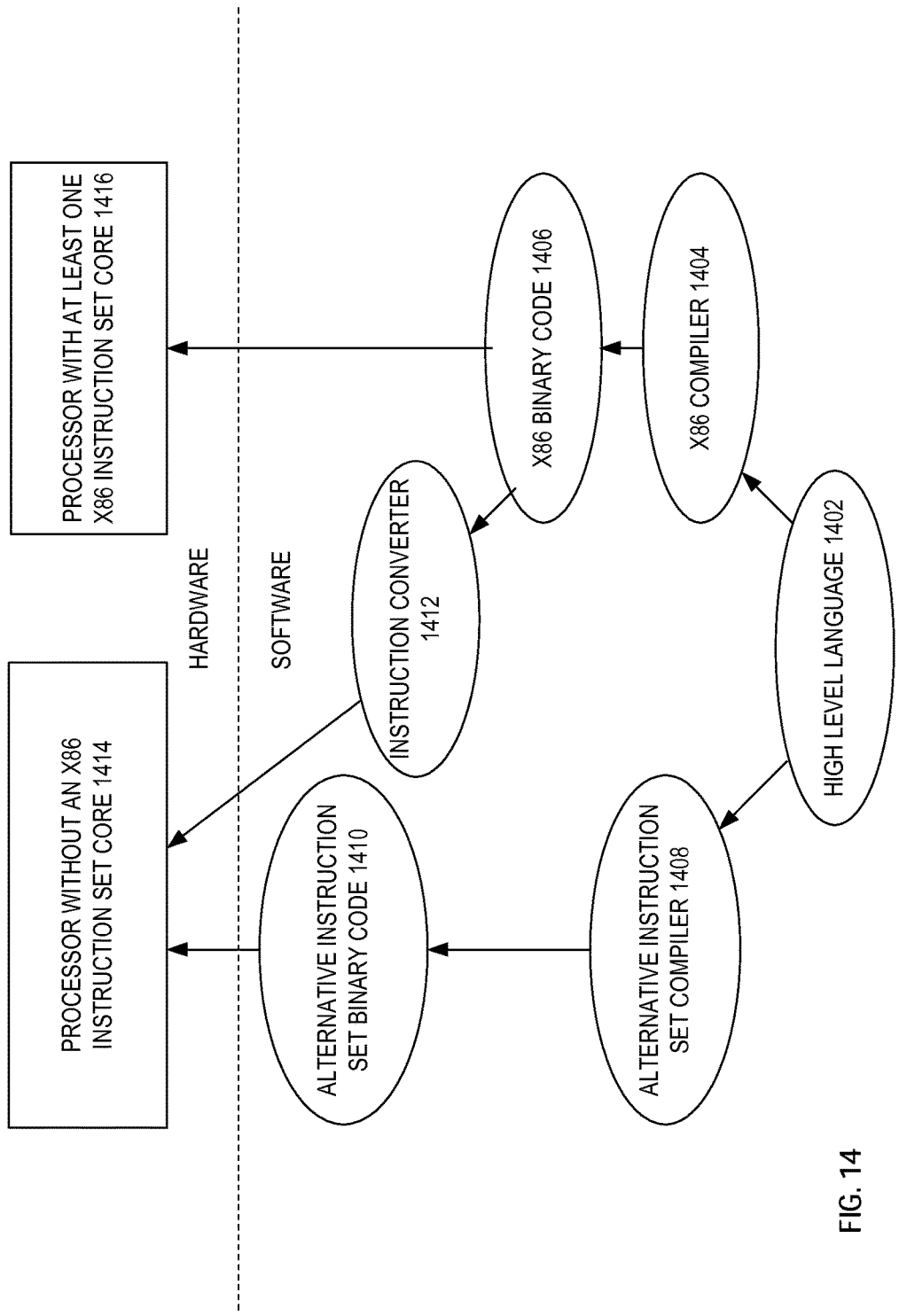
FIG. 14 is a block diagram of use of a software instruction converter to convert binary instructions in a source instruc-

FIG. 14 is a block diagram contrasting the use of a software instruction converter to convert binary instructions in a source instruction set to binary instructions in a target instruction set according to embodiments of the invention. In the illustrated embodiment, the instruction converter is a software instruction converter, although alternatively the instruction converter may be implemented in software, firmware, hardware, or various combinations thereof. FIG. 14 shows a program in a high level language 1402 may be compiled using an x86 compiler 1404 to generate x86 binary code 1406 that may be natively executed by a processor with at least one x86 instruction set core 1416. The processor with at least one x86 instruction set core 1416 represents any processor that can perform substantially the same functions as an Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. The x86 compiler 1404 represents a compiler that is operable to generate x86 binary code 1406 (e.g., object code) that can, with or without additional linkage processing, be executed on the processor with at least one x86 instruction set core 1416. Similarly, FIG. 14 shows the program in the high level language 1402 may be compiled using an alternative instruction set compiler 1408 to generate alternative instruction set binary code 1410 that may be natively executed by a processor without at least one x86 instruction set core 1414 (e.g., a processor with cores that execute the MIPS instruction set of MIPS Technologies of Sunnyvale, Calif. and/or that execute the ARM instruction set of ARM Holdings of Sunnyvale, Calif.). The instruction converter 1412 is used to convert the x86 binary code 1406 into code that may be natively executed by the processor without an x86 instruction set core 1414. This converted code is not likely to be the same as the alternative instruction set binary code 1410 because an instruction converter capable of this is difficult to make; however, the converted code will accomplish the general operation and be made up of instructions from the alternative instruction set. Thus, the instruction converter 1412 represents software, firmware, hardware, or a combination thereof that, through emulation, simulation or any other process, allows a processor or other electronic device that does not have an x86 instruction set processor or core to execute the x86 binary code 1406.

Components, features, and details described for FIG. 1 may also optionally apply to any of FIGS. 2-3 and/or FIGS. 4-5. Moreover, components, features, and details described for any of the apparatus may also optionally apply to any of the methods that may be performed by and/or with such apparatus. Any of the systems may include any of the systems described herein and any of the processors described herein may be included in any of these systems (e.g., FIGS. 9-13).

In the description and claims, the terms "coupled" and/or "connected," along with their derivatives, may have be used. These terms are not intended as synonyms for each other. Rather, in embodiments, "connected" may be used to indicate that two or more elements are in direct physical and/or electrical contact with each other. "Coupled" may mean that two or more elements are in direct physical and/or electrical contact with each other. However, "coupled" may also mean that two or more elements are not in direct contact with each other, but yet still co-operate or interact with each other. For example, an execution unit may be coupled with a decode unit through one or more intervening components. In the figures, arrows are used to show connections and couplings.

In the description and/or claims, the terms "logic," "unit," or "component," may have been used. Each of these terms may be used to refer to hardware, firmware, or various combinations thereof. In example embodiments, each of these terms may refer to integrated circuitry, application specific integrated circuits, analog circuits, digital circuits, programmed logic devices, memory devices including instructions, and the like, and various combinations thereof. In some embodiments, these may include at least some hardware (e.g., transistors, gates, other circuitry components, etc.).

The term "and/or" may have been used. As used herein, the term "and/or" means one or the other or both (e.g., A and/or B means A or B or both A and B).

In the description above, specific details have been set forth in order to provide a thorough understanding of the embodiments. However, other embodiments may be practiced without some of these specific details. The scope of the invention is not to be determined by the specific examples provided above, but only by the claims below. In other instances, well-known circuits, structures, devices, and operations have been shown in block diagram form and/or without detail in order to avoid obscuring the understanding of the description. Where considered appropriate, reference numerals, or terminal portions of reference numerals, have been repeated among the figures to indicate corresponding or analogous elements, which may optionally have similar or the same characteristics, unless specified or clearly apparent otherwise.

Certain operations may be performed by hardware components, or may be embodied in machine-executable or circuit-executable instructions, that may be used to cause and/or result in a machine, circuit, or hardware component (e.g., a processor, portion of a processor, circuit, etc.) programmed with the instructions performing the operations. The operations may also optionally be performed by a combination of hardware and software. A processor, machine, circuit, or hardware may include specific or particular circuitry or other logic (e.g., hardware potentially combined with firmware and/or software) is operable to execute and/or process the instruction and store a result in response to the instruction.

Some embodiments include an article of manufacture (e.g., a computer program product) that includes a machine-readable medium. The medium may include a mechanism that provides, for example stores, information in a form that is readable by the machine. The machine-readable medium may provide, or have stored thereon, an instruction or sequence of instructions, that if and/or when executed by a machine are operable to cause the machine to perform and/or result in the machine performing one or operations, methods, or techniques disclosed herein.

In some embodiments, the machine-readable medium may include a non-transitory machine-readable storage medium. For example, the non-transitory machine-readable storage medium may include a floppy diskette, an optical storage medium, an optical disk, an optical data storage device, a CD-ROM, a magnetic disk, a magneto-optical disk, a read only memory (ROM), a programmable ROM (PROM), an erasable-and-programmable ROM (EPROM), an electrically-erasable-and-programmable ROM (EEPROM), a random access memory (RAM), a static-RAM (SRAM), a dynamic-RAM (DRAM), a Flash memory, a phase-change memory, a phase-change data storage material, a non-volatile memory, a non-volatile data storage device, a non-transitory memory, a non-transitory data storage device, or the like. The non-transitory machine-readable storage medium does not consist of a transitory propagated signal. In some embodiments, the storage medium may include a tangible medium that includes solid matter.

Examples of suitable machines include, but are not limited to, a general-purpose processor, a special-purpose processor, a digital logic circuit, an integrated circuit, or the like. Still other examples of suitable machines include a computer system or other electronic device that includes a processor, a digital logic circuit, or an integrated circuit. Examples of such computer systems or electronic devices include, but are not limited to, desktop computers, laptop computers, notebook computers, tablet computers, netbooks, smartphones, cellular phones, servers, network devices (e.g., routers and switches.), Mobile Internet devices (MIDs), media players, smart televisions, nettops, set-top boxes, and video game controllers.

Reference throughout this specification to "one embodiment," "an embodiment," "one or more embodiments," "some embodiments," for example, indicates that a particular feature may be included in the practice of the invention but is not necessarily required to be. Similarly, in the description various features are sometimes grouped together in a single embodiment, Figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects lie in less than all features of a single disclosed embodiment. Thus, the claims following the Detailed Description are hereby expressly incorporated into this Detailed Description, with each claim standing on its own as a separate embodiment of the invention.

EXAMPLE EMBODIMENTS

The following examples pertain to further embodiments. Specifics in the examples may be used anywhere in one or more embodiments.

Example 1 is a processor or other apparatus that includes a decode unit to decode an exception handler return instruction. The apparatus also includes an exception handler return execution unit coupled with the decode unit. The exception handler return execution unit, responsive to the exception handler return instruction, is to not configure the processor to enable delivery of a subsequently received nonmaskable interrupt (NMI) to an NMI handler if an exception, which corresponds to the exception handler return instruction, was taken within the NMI handler. The exception handler return execution unit, responsive to the exception handler return instruction, is to configure the processor to enable the delivery of the subsequently received NMI to the NMI handler if the exception was not taken within the NMI handler.

Example 2 includes the processor of Example 1, further including a preserved NMI indication checker unit, responsive to the exception handler return instruction, to check a preserved indication of whether the exception was taken within the NMI handler in an exception frame corresponding to the exception that has been retrieved from memory (e.g., popped from a stack), and determine whether to configure the processor to enable the delivery of the subsequently received NMI based in part on the preserved indication.

Example 3 includes the processor of Example 2, optionally in which the preserved NMI indication checker unit, responsive to the exception handler return instruction, is to determine not to configure the processor to enable the delivery of the subsequently received NMI when the preserved indication has a first value, or determine to configure the processor to enable the delivery of the subsequently received NMI when the preserved indication has a second different value.

Example 4 includes the processor of Example 2, optionally in which the preserved indication has a position in the exception frame that does not correspond to one or more counterpart bits in a flags register of the processor.

Example 5 includes the processor of Example 2, optionally in which the preserved indication has a position in the exception frame that corresponds to one or more reserved bits in a flags register of the processor, but optionally in which the processor still reserves the one or more reserved bits in the flags register.

Example 6 includes the processor of Example 1, optionally in which the exception handler return execution unit, responsive to the exception handler return instruction, is to check a preserved NMI disable control, which is a preserved copy of an NMI disable control of the processor, which is used to alternately enable and defer delivery of NMI. The exception handler return execution unit, responsive to the exception handler return instruction, is to configure the processor to enable the delivery of the subsequently received NMI to the NMI handler if the exception was not taken within the NMI handler by changing the NMI disable control of the processor.

Example 7 includes the processor of any one of Examples 1 to 6, further including a nested NMI prevention enable control checker unit, responsive to the exception handler return instruction, to check a nested NMI prevention enable control, which alternatively enables and disables a nested NMI prevention mechanism. The mechanism, when enabled, includes the exception handler return execution unit conditioning the enabling of the delivery of the subsequently received NMI based on whether the exception was taken within the NMI handler.

Example 8 includes the processor of any one of Examples 1 to 6, optionally in which the exception handler return instruction has an opcode that is also to be used to return from an NMI handler.

Example 9 is a method in a processor that includes receiving a first exception handler return instruction that has been used to return from an exception handler corresponding to a first exception that was not taken within a nonmaskable interrupt (NMI) handler. The method includes configuring the processor to enable delivery of subsequently received NMI responsive to the first exception handler return instruction. The method also includes receiving a second exception handler return instruction that has been used to return from an exception handler corresponding to a second exception that was taken within the NMI handler. The method includes not configuring the processor to enable delivery of subsequently received NMI responsive to the second exception handler return instruction.

Example 10 includes the method of Example 9, further including, responsive to the second exception handler return instruction, checking a preserved indication that the second exception was taken within the NMI handler in an exception frame retrieved from memory.

Example 11 includes the method of Example 10, optionally in which checking the preserved indication includes checking the preserved indication in a set of one or more bits of the exception frame that does not have a counterpart set of one or more bits in a flags register of the processor.

Example 12 includes the method of Example 10, optionally in which checking the preserved indication includes checking the preserved indication in a set of one or more bits of the exception frame that corresponds to a set of one or more reserved bits in a flags register of a processor.

Example 13 includes the method of Example 9, optionally in which configuring the processor to enable the delivery of the subsequently received NMI responsive to the first exception handler return instruction includes changing an NMI disable control. The NMI disable control is also changed by the processor responsive to an NMI delivered to an NMI handler.

Example 14 is a processor or other apparatus that includes a nonmaskable interrupt (NMI) determination unit to determine whether an exception was taken within an NMI handler. The apparatus also includes an NMI preservation unit coupled with the NMI determination unit. The NMI preservation unit is to preserve an indication of whether the exception was taken within the NMI handler.

Example 15 includes the processor of Example 14, optionally in which the NMI preservation unit includes an NMI disable control preservation unit that is to preserve an NMI disable control of a processor. The NMI disable control is to be used to alternately temporarily disable and enable delivery of NMIs.

Example 16 includes the processor of Example 15, optionally in which the NMI preservation unit is to preserve the indication of whether the exception was taken within the NMI handler in an exception frame that is to be stored in memory (e.g., on a stack structure).

Example 17 includes the processor of Example 16, optionally in which the NMI preservation unit is to preserve the indication in a set of one or more bits of the exception frame that does not have a counterpart set of one or more bits in a flags register of a processor.

Example 18 includes the processor of Example 16, optionally in which the NMI preservation unit is to preserve the indication in a set of one or more bits of the exception frame that corresponds to a set of one or more reserved bits in a flags register of a processor.

Example 19 includes the processor of Example 14, optionally in which the NMI determination unit includes an NMI disable control determination unit that is to determine whether the exception was taken within the NMI handler by checking an NMI disable control of a processor. The NMI disable control is to be used to alternately temporarily disable and enable delivery of NMIs.

Example 20 includes the processor of any one of Examples 14 to 19, further including a nested NMI prevention enable control checker unit to check a nested NMI prevention enable control of a processor, which alternatively enables and disables a nested NMI prevention mechanism. The nested NMI prevention mechanism when enabled includes the NMI preservation unit preserving the indication of whether the exception was taken within the NMI handler, and when not enabled does not include the NMI preservation unit preserving the indication.

Example 21 is a system to process instructions that includes an interconnect, and a processor coupled with the interconnect. The processor is to receive an exception handler return instruction. The processor, in response to the exception handler return instruction, is to keep the processor configured to defer delivery of a subsequently received nonmaskable interrupt (NMI) to an NMI handler if an exception, which corresponds to the exception handler return instruction, was taken within the NMI handler. The processor, in response to the instruction, is to configure the processor to deliver the subsequently received NMI to the NMI handler if the exception was not taken within the NMI handler. The system also includes a dynamic random access memory (DRAM) coupled with the interconnect.

Example 22 includes the system of Example 21, optionally in which the processor, in response to the exception handler return instruction, is to check a preserved indication of whether the exception was taken within the NMI handler in an exception frame corresponding to the exception that has been retrieved from memory (e.g., a stack).

Example 23 is an article of manufacture that includes a non-transitory machine-readable storage medium. The non-transitory machine-readable storage medium stores an exception handler return instruction. The exception handler return instruction, if executed by a machine, is to cause the machine to perform operations including deferring delivery of a subsequently received nonmaskable interrupt (NMI) to an NMI handler if an exception, which corresponds to the exception handler return instruction, was taken within the NMI handler. The operations also include delivering the subsequently received NMI to the NMI handler if the exception was not taken within the NMI handler.

Example 24 includes the article of manufacture of Example 23, optionally in which the exception handler return instruction, if executed by the machine, is to cause the machine to perform operations including checking a preserved indication of whether the exception was taken within the NMI handler in an exception frame that has been received from memory (e.g., a stack).

Example 25 is a processor or other apparatus that is operative to perform the method of any one of Examples 9 to 13.

Example 26 is a processor or other apparatus that includes means for performing the method of any one of Examples 9 to 13.

Example 27 is a processor that includes any combination of units and/or logic and/or circuitry and/or means for performing the method of any one of Examples 9 to 13.

Example 28 is an article of manufacture that includes an optionally non-transitory machine-readable medium, which optionally stores or otherwise provides an instruction, which if and/or when executed by a processor, computer system, electronic device, or other machine, is operative to cause the machine to perform the method of any one of Examples 9 to 13.

Example 29 is a computer system, other electronic device, or other apparatus including a bus or other interconnect, the processor of any one of Examples 1 to 8 coupled with the interconnect, and at least one component coupled with the interconnect that is selected from a dynamic random access memory (DRAM), a network interface, a graphics chip, a wireless communications chip, a Global System for Mobile Communications (GSM) antenna, a phase change memory, and a video camera.

Example 30 is a processor or other apparatus substantially as described herein.

Example 31 is a processor or other apparatus that is operative to perform any method substantially as described herein.

Example 32 is a processor or other apparatus that is operative to perform any exception handler return instruction substantially as described herein.

What is claimed is:

1. A processor comprising:
   a decode unit to decode an exception handler return instruction; and
   an exception handler return execution unit coupled with the decode unit, the exception handler return execution unit, responsive to the exception handler return instruction, to:
   not configure the processor to enable delivery of a subsequently received nonmaskable interrupt (NMI) to an NMI handler if an exception, which corresponds to the exception handler return instruction, was taken within the NMI handler; and
   configure the processor to enable the delivery of the subsequently received NMI to the NMI handler if the exception was not taken within the NMI handler.

2. The processor of claim 1, further comprising a preserved NMI indication checker unit, responsive to the exception handler return instruction, to:
   check a preserved indication of whether the exception was taken within the NMI handler in an exception frame corresponding to the exception that has been retrieved from memory; and
   determine whether to configure the processor to enable the delivery of the subsequently received NMI based in part on the preserved indication.

3. The processor of claim 2, wherein the preserved NMI indication checker unit, responsive to the exception handler return instruction, is to:
   determine not to configure the processor to enable the delivery of the subsequently received NMI when the preserved indication has a first value; or
   determine to configure the processor to enable the delivery of the subsequently received NMI when the preserved indication has a second different value.

4. The processor of claim 2, wherein the preserved indication has a position in the exception frame that does not correspond to one or more counterpart bits in a flags register of the processor.

5. The processor of claim 2, wherein the preserved indication has a position in the exception frame that corresponds to one or more reserved bits in a flags register of the processor but wherein the processor still reserves the one or more reserved bits in the flags register.

6. The processor of claim 1, wherein the exception handler return execution unit, responsive to the exception handler return instruction, is to:
check a preserved NMI disable control, which is a preserved copy of an NMI disable control of the processor, which is used to alternately enable and defer delivery of NMI; and
configure the processor to enable the delivery of the subsequently received NMI to the NMI handler if the exception was not taken within the NMI handler by changing the NMI disable control of the processor.

7. The processor of claim 1, further comprising a nested NMI prevention enable control checker unit, responsive to the exception handler return instruction, to check a nested NMI prevention enable control, which alternatively enables and disables a nested NMI prevention mechanism, wherein the mechanism when enabled includes the exception handler return execution unit conditioning the enabling of the delivery of the subsequently received NMI based on whether the exception was taken within the NMI handler.

8. The processor of claim 1, wherein the exception handler return instruction has an opcode that is also to be used to return from an NMI handler.

9. A method in a processor comprising:
receiving a first exception handler return instruction that has been used to return from an exception handler corresponding to a first exception that was not taken within a nonmaskable interrupt (NMI) handler;
configuring the processor to enable delivery of subsequently received NMI responsive to the first exception handler return instruction;
receiving a second exception handler return instruction that has been used to return from an exception handler corresponding to a second exception that was taken within the NMI handler; and
not configuring the processor to enable delivery of subsequently received NMI responsive to the second exception handler return instruction.

10. The method of claim 9, further comprising, responsive to the second exception handler return instruction, checking a preserved indication that the second exception was taken within the NMI handler in an exception frame retrieved from memory.

11. The method of claim 10, wherein checking the preserved indication comprises checking the preserved indication in a set of one or more bits of the exception frame that does not have a counterpart set of one or more bits in a flags register of the processor.

12. The method of claim 10, wherein checking the preserved indication comprises checking the preserved indication in a set of one or more bits of the exception frame that corresponds to a set of one or more reserved bits in a flags register of a processor.

13. The method of claim 9, wherein configuring the processor to enable the delivery of the subsequently received NMI responsive to the first exception handler return instruction comprises changing an NMI disable control, wherein the NMI disable control is also changed by the processor responsive to an NMI delivered to an NMI handler.

14. A processor comprising:
a nonmaskable interrupt (NMI) determination unit to determine whether an exception was taken within an NMI handler; and
an NMI preservation unit coupled with the NMI determination unit, the NMI preservation unit to preserve an indication of whether the exception was taken within the NMI handler, wherein the NMI preservation unit comprises an NMI disable control preservation unit that is to preserve an NMI disable control of the processor, wherein the NMI disable control is to be used to alternately temporarily disable and enable delivery of NMIs, wherein the NMI preservation unit is to preserve the indication of whether the exception was taken within the NMI handler in an exception frame that is to be stored in memory on a stack structure, and wherein the NMI preservation unit is to preserve the indication in a set of one or more bits of the exception frame that does not have a counterpart set of one or more bits in a flags register of the processor.

15. The processor of claim 14, wherein the NMI determination unit comprises an NMI disable control determination unit that is to determine whether the exception was taken within the NMI handler by checking an NMI disable control of a processor, wherein the NMI disable control is to be used to alternately temporarily disable and enable delivery of NMIs.

16. The processor of claim 14, further comprising a nested NMI prevention enable control checker unit to check a nested NMI prevention enable control of a processor which alternatively enables and disables a nested NMI prevention mechanism, wherein the nested NMI prevention mechanism when enabled includes the NMI preservation unit preserving the indication of whether the exception was taken within the NMI handler and when not enabled does not include the NMI preservation unit preserving the indication.

17. A processor comprising:
a nonmaskable interrupt (NMI) determination unit to determine whether an exception was taken within an NMI handler; and
an NMI preservation unit coupled with the NMI determination unit, the NMI preservation unit to preserve an indication of whether the exception was taken within the NMI handler, wherein the NMI preservation unit comprises an NMI disable control preservation unit that is to preserve an NMI disable control of the processor, wherein the NMI disable control is to be used to alternately temporarily disable and enable delivery of NMIs, wherein the NMI preservation unit is to preserve the indication of whether the exception was taken within the NMI handler in an exception frame that is to be stored in memory on a stack structure, and wherein the NMI preservation unit is to preserve the indication in a set of one or more bits of the exception frame that corresponds to a set of one or more reserved bits in a flags register of the processor.

18. A system to process instructions comprising:
an interconnect;
a processor coupled with the interconnect, the processor to receive an exception handler return instruction, the processor, in response to the exception handler return instruction, to:
keep the processor configured to defer delivery of a subsequently received nonmaskable interrupt (NMI) to an NMI handler if an exception, which corresponds to the exception handler return instruction, was taken within the NMI handler; and configure the processor to deliver the subsequently received NMI to the NMI handler if the exception was not taken within the NMI handler; and a dynamic random access memory (DRAM) coupled with the interconnect.

19. The system of claim 18, wherein the processor, in response to the exception handler return instruction, is to check a preserved indication of whether the exception was taken within the NMI handler in an exception frame corresponding to the exception that has been retrieved from memory.

* * * * *